(12) United States Patent
Pei et al.

(10) Patent No.: US 7,785,656 B2
(45) Date of Patent: Aug. 31, 2010

(54) ELECTROACTIVE POLYMER PRE-STRAIN

(75) Inventors: Qibing Pei, Temecula, CA (US); Ronald E. Pelrine, Louisville, CO (US); Marcus Rosenthal, Pacifica, CA (US)

(73) Assignee: SRI International, Menlo Park, CA (US)

( * ) Notice: Subject to any disclaimer, the term of this patent is extended or adjusted under 35 U.S.C. 154(b) by 162 days.

(21) Appl. No.: 12/194,340

(22) Filed: Aug. 19, 2008

(65) Prior Publication Data

US 2008/0308974 A1    Dec. 18, 2008

Related U.S. Application Data

(62) Division of application No. 10/928,921, filed on Aug. 27, 2004, now Pat. No. 7,436,099.

(60) Provisional application No. 60/499,088, filed on Aug. 29, 2003.

(51) Int. Cl.
*B05D 3/00* (2006.01)
*B05D 3/02* (2006.01)
*B05D 5/12* (2006.01)

(52) U.S. Cl. .................. 427/58; 427/171; 427/337; 427/384; 427/552; 427/557

(58) Field of Classification Search ............. 427/58, 427/171, 379, 384, 552, 557
See application file for complete search history.

(56) References Cited

U.S. PATENT DOCUMENTS

| 3,816,774 | A | 6/1974 | Ohnuki et al. |
| 4,088,915 | A | 5/1978 | Kodama |
| 4,342,936 | A | 8/1982 | Marcus |
| 4,346,505 | A | 8/1982 | Lemonon et al. |
| 4,384,394 | A | 5/1983 | Lemonon |
| 4,400,634 | A | 8/1983 | Micheron |
| 4,518,555 | A | 5/1985 | Ravinet |
| 4,843,275 | A | 6/1989 | Radice |

(Continued)

FOREIGN PATENT DOCUMENTS

JP    2001-286162    10/2001

(Continued)

OTHER PUBLICATIONS

Australian Office Action dated Oct. 31, 2008 from Australian Application No. 2004316255.

(Continued)

*Primary Examiner*—Brian K Talbot
(74) *Attorney, Agent, or Firm*—Levine Bagade Han LLP

(57) ABSTRACT

The present invention provides electroactive polymers, transducers and devices that maintain pre-strain in one or more portions of an electroactive polymer. Electroactive polymers described herein may include a pre-strained portion and a stiffened portion configured to maintain pre-strain in the pre-strained portion. One fabrication technique applies pre-strain to a partially cured electroactive polymer. The partially cured polymer is then further cured to stiffen and maintain the pre-strain. In another fabrication technique, a support layer is coupled to the polymer that maintains pre-strain in a portion of an electroactive polymer. Another embodiment of the invention cures a polymer precursor to maintain pre-strain in an electroactive polymer.

20 Claims, 10 Drawing Sheets

U.S. PATENT DOCUMENTS

| | | | |
|---|---|---|---|
| 4,885,783 | A | 12/1989 | Whitehead et al. |
| 5,452,878 | A | 9/1995 | Gravesen et al. |
| 5,589,725 | A | 12/1996 | Haertling |
| 5,632,841 | A | 5/1997 | Hellbaum et al. |
| 5,977,685 | A | 11/1999 | Kurita et al. |
| 6,048,622 | A | 4/2000 | Hagood, IV et al. |
| 6,060,811 | A * | 5/2000 | Fox et al. ............ 310/311 |
| 6,156,842 | A | 12/2000 | Hoenig et al. |
| 6,388,043 | B1 | 5/2002 | Langer et al. |
| 6,471,185 | B2 | 10/2002 | Lewin |
| 6,545,384 | B1 | 4/2003 | Pelrine et al. |
| 6,593,155 | B2 | 7/2003 | Mohler |
| 6,646,077 | B1 | 11/2003 | Lyons |
| 6,664,718 | B2 | 12/2003 | Pelrine |
| 6,768,246 | B2 | 7/2004 | Pelrine |
| 6,781,284 | B1 * | 8/2004 | Pelrine et al. ............ 310/330 |
| 6,809,462 | B2 | 10/2004 | Pelrine |
| 6,812,624 | B1 | 11/2004 | Pei |
| 6,882,086 | B2 | 4/2005 | Kornbluh |
| 6,911,764 | B2 | 6/2005 | Pelrine et al. |
| 7,436,099 | B2 * | 10/2008 | Pei et al. ............ 310/311 |
| 2002/0013545 | A1 | 1/2002 | Soltanpour |
| 2002/0050769 | A1 | 5/2002 | Pelrine |

FOREIGN PATENT DOCUMENTS

| | | |
|---|---|---|
| WO | WO 99/37921 | 7/1999 |
| WO | WO 01/06575 | 1/2001 |
| WO | WO 01/06579 | 1/2001 |
| WO | WO 01/59852 | 8/2001 |
| WO | WO 02/37660 | 5/2002 |
| WO | WO 02/37892 | 5/2002 |
| WO | WO 03/056274 | 7/2003 |
| WO | WO 03/056287 | 7/2003 |
| WO | WO 2004/027970 | 4/2004 |
| WO | WO 2004/053782 | 6/2004 |
| WO | WO 2004/074797 | 9/2004 |
| WO | WO 2004/009363 | 11/2004 |

OTHER PUBLICATIONS

Supplementary European Search Report dated Nov. 12, 2008 from European Application No. 04821599.0.

Ajluni, Cheryl, "Pressure Sensors Strive to Stay on Top, New Silicon Micromachining Techniques and Designs Promise Higher Performance", *Electronic Design—Advanced Technology Series*, Oct. 3, 1994, pp. 67-74.

Bar-Cohen, Yoseph, JPL, *WorldWide ElectroActive Polymers, EAP (Artificial Muscles) Newsletter*, vol. 1, No. 1, Jun. 1999.

Cheng et al., "Transverse Strain Responses In The Electrostrictive Poly(Vinylidene Fluoride- Trifluorethylene) Copolymer," *Appl. Phys. Lett.* vol. 74, No. 13, pp. 1901-1903, Mar. 29, 1999.

Kornbluh, R., Pelrine R., Eckerie, J., Joseph, J., "Electrostrictive Polymer Artificial Muscle Actuators", IEEE International Conference on Robotics and Automation, Leuven, Belgium, 1998.

Ktech's PVDF Sensors, http://www.ktech.com/pvdf.htm, Jun. 6, 2001, pp. 1-5.

Pelrine, R., R. Kornbluh, and G. Kofod, "High Strain Actuator Materials Based on Dielectric Elastomers," submitted to *Advanced Materials* (May 2000).

Pelrine, R., R. Kornbluh, and J. Joseph, FY 1996 *Final Report on Artificial Muscle for Small Robots*, ITAD-7228, FR-97-058, SRI International, Menlo Park, California, 1997.

Pelrine, R., R. Kornbluh, and J. Joseph, FY 1997 *Final Report on Artificial Muscle for Small Robots*, ITAD-1612-FR-98-041, SRI International, Menlo Park, California, 1998.

Pelrine, R., R. Kornbluh, and J. Joseph, FY 1998 *Final Report on Artificial Muscle for Small Robots*, ITAD-3482-FR-99-36, SRI International, Menlo Park, California, 1999.

Pelrine, R., R. Kornbluh, and J. Joseph, FY 1999 *Final Report on Artificial Muscle for Small Robots*, ITAD-10162-FR-00-27, SRI International, Menlo Park, California, 2000.

Pelrine, R., R. Kornbluh, J. Joseph, Q. Pei, and S. Chiba, "Recent Progress in Artificial Muscle Micro Actuators", SRI International, Tokyo, 1999 MITI/NEEDOIMNIC, 1999.

Pelrine, R., R. Kornbluh, Q. Pei, and J. Joseph, "High Speed Electrically Actuated Elastomers with Over 100% Strain," *Science*, vol. 287, No. 5454, pp. 1-21, 2000.

Treloar, L.R.G, "Mechanics of Rubber Elasticity," *J Polymer Science, Polymer Symposium*, No. 48, pp. 107-123, 1974.

U.S. Appl. No. 09/619,848, entitled: "Electroactive Polymer Generators" by inventors Pelrine et al., filed Jul. 20, 2000.

Uchino, K., "Electrostrictive Actuators: Materials and Applications", *Ceramic Bulletin*, 65(4), pp. 647-652, 1986.

Winters, J., "Muscle as an Actuator for Intelligent Robots", Robotics Research: Trans. Robotics International of SME, Scottsdale, AZ (Aug. 18-21, 1986).

Zhenyi, M., J.I. Scheinbeim, J.W. Lee, and B.A. Newman. 1994. "High Field Electrostrictive Response of Polymers," *Journal of Polymer Sciences, Part B—Polymer Physics*, vol. 32, pp. 2721-2731, 1994.

Office Action dated Jan. 16, 2008 in U.S. Appl. No. 10/928,921.

Notice of Allowance dated Jul. 18, 2008 in U.S. Appl. No. 10/928,921.

Puers et al, "A Capacitive Pressure Sensor with Low Impedance Output and Active Suppression of Parasitic Effects," Sensors and Actuators, A21-A23 (1990) 108-114.

Robert Puers, "Capacitive sensors: when and how to use them," Sensors and Actuators A, 37-38 (1993) 93-105.

* cited by examiner

ELECTROACTIVE POLYMER PRE-STRAIN

CROSS-REFERENCE TO RELATED APPLICATION

This divisional application claims priority under U.S.C. §120 from U.S. patent application Ser. No. 10/928,921, filed Aug. 27, 2004, titled "ELECTROACTIVE POLYMER PRE-STRAIN", and naming Pei et al. as inventors, which further claims priority under 35 U.S.C. §119(e) from U.S. Provisional Patent Application No. 60/499,088 filed Aug. 29, 2003, also naming Pei et al. as inventors, and titled "METHOD FOR IMPROVING PERFORMANCE OF ELECTROACTIVE POLYMERS", which are incorporated by reference herein for all purposes.

U.S. GOVERNMENT RIGHTS

This application was made in part with government support under contract number N00014-02-C-0252 awarded by the United States Office of Naval Research. The government has certain rights in the invention.

BACKGROUND OF THE INVENTION

The present invention relates generally to electroactive polymers that convert between electrical energy and mechanical energy. More particularly, the present invention relates to pre-strained electroative polymers.

In many applications, it is desirable to convert between electrical energy and mechanical energy. Exemplary applications requiring conversion from electrical to mechanical energy include robotics, motors, pumps, valves, speakers, sensors, microfluidic devices, general automation, disk drives, and prosthetic devices. These applications include one or more transducers that convert electrical energy into mechanical work—on a macroscopic or microscopic level. Exemplary applications requiring conversion from mechanical to electrical energy include sensors and generators.

New electroactive polymers capable of converting electrical energy to mechanical energy, and vice versa, are available for a wide range of energy conversion applications. Electroactive elastomers, one specific class of electroactive polymer, may exhibit high energy density, stress, and electromechanical conversion efficiency. The performance of many electroactive polymers is notably increased when the polymer is pre-strained.

Pre-strain traditionally required deformation of the polymer by stretching the polymer in tension and fixing one or more polymer edges while stretched. Sturdy and bulky support structures such as frames were commonly used to hold the pre-strain. Mechanisms, such as a spring, have also been used in a rolled electroactive polymer device to support polymer pre-strain. The dependence on frames and external mechanisms decreases power density of electroactive polymers and their related devices.

In view of the foregoing, alternative techniques to acquire and maintain pre-strain in an electroactive polymer would be desirable.

SUMMARY OF THE INVENTION

The present invention provides electroactive polymers, transducers and devices that maintain pre-strain in one or more portions of an electroactive polymer. Electroactive polymers described herein may include a pre-strained portion and a stiffened portion configured to maintain pre-strain in the pre-strained portion. In one embodiment, the present invention applies pre-strain to a partially cured electroactive polymer. The partially cured polymer is then further cured to stiffen and maintain the pre-strain. In another embodiment, a support layer is coupled to the polymer that maintains pre-strain in a portion of an electroactive polymer.

Another embodiment of the invention cures a polymer precursor to maintain pre-strain in an electroactive polymer. The curable polymer precursor may be applied to a surface of an electroactive polymer sheet or film and allowed to at least partially disperse or diffuse into the film before curing.

In another embodiment, a precursor for a support polymer is mixed with a precursor for an electroactive polymer before forming the polymer, e.g., into a thin film. The precursor is cured for the support polymer to form the support polymer in a stiffened portion of the polymer after forming the electroactive polymer.

In one aspect, the present invention relates to an electroactive polymer transducer. The transducer comprises at least two electrodes. The transducer also comprises an electroactive polymer in electrical communication with the at least two electrodes. The electroactive polymer includes a pre-strained portion and a stiffened portion configured to maintain pre-strain in the pre-strained portion.

In another aspect, the present invention relates to an electroactive polymer transducer for converting between electrical and mechanical energy. The transducer comprises at least two electrodes. The transducer also comprises an electroactive polymer in electrical communication with the at least two electrodes and including a pre-strained portion. The transducer further comprises a support layer coupled to a surface portion of the electroactive polymer and configured to maintain pre-strain in the pre-strained portion.

In yet another aspect, the present invention relates to an electroactive polymer transducer for converting between electrical and mechanical energy. The transducer comprises at least two electrodes. The transducer also comprises an electroactive polymer in electrical communication with the at least two electrodes. The electroactive polymer includes a first pre-strained portion and a second pre-strained portion. The first pre-strained portion comprises a greater pre-strain than the second pre-strained portion.

In still another aspect, the present invention relates to a method for forming an electroactive polymer. The method comprises partially curing a composition comprising a precursor for an electroactive polymer to form a partially cured electroactive polymer. The method also comprises stretching the partially cured electroactive polymer to achieve a pre-strain for the electroactive polymer. The method additionally comprises further curing a portion of the electroactive polymer to stiffen the portion.

In another aspect, the present invention relates to a method for forming an electroactive polymer. The method comprises stretching the electroactive polymer to achieve a pre-strain in a portion of the polymer. The method also comprises coupling a support layer to a surface portion of the polymer when the polymer is pre-strained. The support layer overlaps the pre-strained portion and at least partially maintains the pre-strain in the portion.

In yet another aspect, the present invention relates to a method for forming an electroactive polymer. The method comprises applying a polymer precursor to a surface of a portion of the electroactive polymer. The method also comprises stretching the electroactive polymer to achieve a pre-strain. The method additionally comprises curing the polymer precursor to stiffen said portion.

In still another aspect, the present invention relates to a method for forming an electroactive polymer. The method comprises providing a composition comprising a precursor for an electroactive polymer and a precursor for a support polymer. The method also comprises forming the electroactive polymer from the composition. The method further comprises stretching the electroactive polymer to achieve a pre-strain in a portion of the electroactive polymer. The method additionally comprises curing the precursor for the support polymer to form the support polymer in a stiffened portion of the polymer.

These and other features and advantages of the present invention will be described in the following description of the invention and associated figures.

DETAILED DESCRIPTION OF THE PREFERRED EMBODIMENTS

Figure 1A:
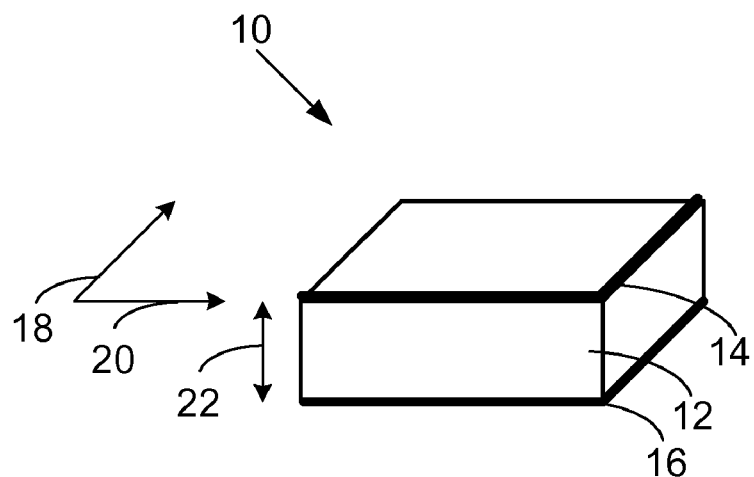
FIGS. 1A and 1B illustrate a top perspective view of a transducer before and after application of a voltage in accordance with one embodiment of the present invention.

The present invention is described in detail with reference to a few preferred embodiments as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Overview

Electroactive polymers convert between mechanical and electrical energy. The present invention relates to electroactive polymers that are pre-strained to improve conversion between electrical and mechanical energy. The pre-strain enhances performance of the electroactive polymer. For example, the pre-strain improves mechanical response of an electroactive polymer relative to a non-strained electroactive polymer. The improved mechanical response enables greater mechanical work for an electroactive polymer, e.g., larger deflections and actuation pressures. A 2-fold to 25-fold in area pre-strain significantly improves performance of many electroactive elastomers. For example, when pre-strained, acrylic copolymer elastomers (e.g., 3M VHB 4910 provided by 3M Corporation) produce high and reversible electromechanical strain of 100% to 380% in area or linear strain. Linear strains of at least about 200 percent and area strains of at least about 300 percent are common with other pre-strained polymers of the present invention.

The pre-strain may vary in different directions of a polymer. Combining directional variability of the pre-strain, different ways to constrain a polymer, scalability of electroactive polymers to both micro and macro levels, and different polymer orientations (e.g., rolling or stacking individual polymer layers) permits a broad range of transducers, devices, actuators, sensors and generators that convert between electrical and mechanical energy.

The present invention reduces the need for a rigid frame or separate mechanism to hold pre-strain in a polymer (some devices may still include a frame, but one is not needed to maintain pre-strain in the polymer). Reducing or eliminating non-active structures such as a frame for holding pre-strain may reduce the fabrication and structural complexities of an electroactive polymer device, improve the mechanical stability of a device, permit alternative ways to package a device, increase overall device energy density, and reduce the space and weight of electroactive polymer devices.

Several techniques are described to maintain pre-strain in an electroactive polymer. One technique employs a laminate to stiffen one or more portions of the polymer and maintain pre-strain. Another technique employs curing techniques to stiffen one or more portions of the polymer. In another embodiment, the present invention comprises the addition of one or more curable polymer precursors to the electroactive polymer. In a specific embodiment, the curable polymer precursors are applied to a surface of an electroactive polymer sheet or film and allowed to disperse or diffuse into the film. The additives are then cured to form one or more stiffer portions.

In another aspect, the present invention provides methods for fabricating electroactive polymers and electromechanical devices including one or more pre-strained electroactive polymer.

General Structure of Electroactive Polymer Transducers

The transformation between electrical and mechanical energy in transducers and devices of the present invention is based on elastance of an electroactive polymer and energy conversion of one or more portions of an electroactive polymer. To help illustrate the performance of an electroactive polymer in converting electrical energy to mechanical energy, FIG. 1A illustrates a top perspective view of a transducer portion 10 in accordance with one embodiment of the present invention. While electroactive polymer transducers will now be described as structures, those skilled in the area will recognize that the present invention encompasses a methods for performing actions as described below.

The transducer portion 10 comprises an electroactive polymer 12 for converting between electrical energy and mechanical energy. In one embodiment, an electroactive polymer refers to a polymer that acts as an insulating dielectric between two electrodes and may deflect upon application of a voltage difference between the two electrodes. Polymer 12 is in electrical communication with electrodes 14 and 16. More specifically, top and bottom electrodes 14 and 16 attach to electroactive polymer 12 on its top and bottom surfaces, respectively, to provide a voltage difference across a portion of the polymer 12. Polymer 12 deflects with a change in electric field provided by the top and bottom electrodes 14 and 16. Deflection of the transducer portion 10 in response to a change in electric field provided by the electrodes 14 and 16 is referred to as actuation. As the polymer 12 changes in size, the deflection may be used to produce mechanical work.

Figure 1B:
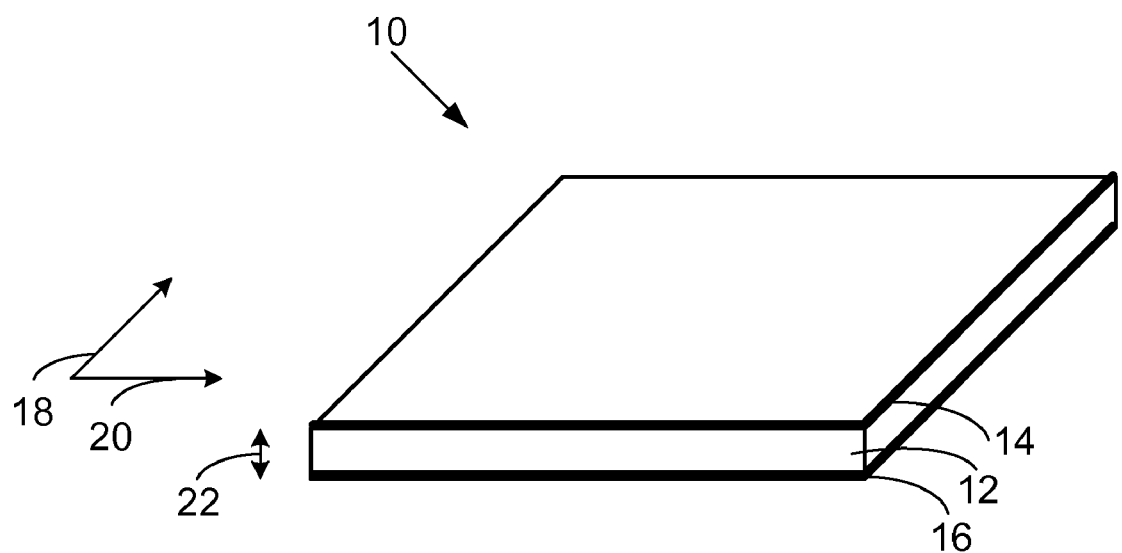

FIG. 1B illustrates a top perspective view of the transducer portion 10 including deflection in response to a change in electric field. In general, deflection refers to any displacement, expansion, contraction, bulging, torsion, linear or area strain, or any other deformation of a portion of the polymer 12. The change in electric field corresponding to the voltage difference applied to or by the electrodes 14 and 16 produces mechanical pressure within polymer 12. In this case, the unlike electrical charges produced by electrodes 14 and 16 attract each other and provide a compressive force between electrodes 14 and 16 and an expansion force on polymer 12 in planar directions 18 and 20, causing polymer 12 to compress between electrodes 14 and 16 and stretch in the planar directions 18 and 20.

After application of the voltage between electrodes 14 and 16, polymer 12 expands (stretches) in both planar directions 18 and 20. In some cases, polymer 12 is incompressible, e.g. has a substantially constant volume under stress. For an incompressible polymer 12, polymer 12 decreases in thickness as a result of the expansion in the planar directions 18 and 20. It should be noted that the present invention is not limited to incompressible polymers and deflection of the polymer 12 may not conform to such a simple relationship.

In general, the transducer portion 10 continues to deflect until mechanical forces balance the electrostatic forces driving the deflection. The mechanical forces include elastic restoring forces of the polymer 12 material, the compliance of electrodes 14 and 16, and any external resistance provided by a device and/or load coupled to the transducer portion 10, etc. The deflection of the transducer portion 10 as a result of the applied voltage may also depend on a number of other factors such as the polymer 12 dielectric constant and the size of polymer 12.

Application of a relatively large voltage difference between electrodes 14 and 16 on the transducer portion 10 shown in FIG. 1A thus causes transducer portion 10 to change to a thinner, larger area shape as shown in FIG. 1B. In this manner, the transducer portion 10 converts electrical energy to mechanical energy. The use of transducer portion 10 to convert mechanical energy to electrical energy will be described below.

As shown in FIGS. 1A and 1B, electrodes 14 and 16 cover the entire portion of polymer 12 as shown. More commonly, electrodes 14 and 16 cover a limited portion of polymer 12 relative to the total surface area of the polymer. This may be done to prevent electrical breakdown around the edge of polymer 12. Electrodes may also be patterned with special shapes to achieve customized surface deflections, as will be described in further detail below. Alternatively, this may be done to utilize incompressibility of the polymer and produce surface features and deformations on one or more of the polymer surfaces.

As the term is used herein, an active area refers to a portion of a transducer comprising polymer material 12 and at least two electrodes. When the active area is used to convert electrical energy to mechanical energy, the active area includes a portion of polymer 12 having sufficient electrostatic force to enable deflection of the portion. When the active area is used to convert mechanical energy to electrical energy, the active area includes a portion of polymer 12 having sufficient deflection to enable a change in electrostatic energy. As will be described below, a polymer of the present invention may have multiple active areas.

Generally, polymers that are suitable for use with transducers of this invention include any substantially insulating polymer or rubber (or combination thereof) that deforms in response to an electrostatic force or whose deformation results in a change in electric field. Preferably, the polymer's deformation is reversible over a wide range of strains. Many elastomeric polymers may serve this purpose. In designing or choosing an appropriate polymer, one should consider the optimal material, physical, and chemical properties. Such properties can be tailored by judicious selection of monomer (including any side chains), additives, degree of cross-linking, crystallinity, molecular weight, etc.

Polymer 12 may assume many different physical and chemical states. For example, the polymer may be used with or without additives such as plasticizers. And they may be monolithic polymeric sheets or combinations of polymers such as laminates or patchworks. Further, the polymers may exist in a single phase or multiple phases. One example of a multiphase material is a polymeric matrix having inorganic filler particles admixed therewith.

Regardless of the ultimate chemical and physical state of the transducer polymer, it will include a polymer matrix. That matrix may be a homopolymer or copolymer, cross-linked or uncross-linked, linear or branched, etc. Exemplary classes of polymer suitable for use with transducers of this invention include silicone elastomers, acrylic elastomers, polyurethanes, thermoplastic elastomers, copolymers comprising PVDF, pressure-sensitive adhesives, fluoroelastomers, polymers comprising silicone and acrylic moieties, and the like. Obviously, combinations of some of these materials may be used as the polymer matrix in transducers of this invention. Copolymers and blends fall within the class of suitable polymers. One example is a blend of a silicone elastomer and an acrylic elastomer.

One suitable commercially available polymer is NuSil CF19-2186 as provided by NuSil Technology of Carpenteria, Calif. An example of a suitable silicone elastomer is Dow Corning HS3 as provided by Dow Corning of Wilmington, Del. One example of a suitable fluorosilicone is Dow Corning 730 as provided by Dow Corning of Wilmington, Del. Examples of suitable acrylics include any acrylic in the 4900 VHB acrylic series as provided by 3M Corp. of St. Paul, Minn.

Suitable actuation voltages for electroactive polymers, or portions thereof, may vary based on the material properties of the electroactive polymer, such as the dielectric constant, as well as the dimensions of the polymer, such as the thickness of the polymer film. For example, actuation electric fields used to actuate polymer 12 in FIG. 1A may range in magnitude from about 0 V/m to about 440 MV/m. Actuation electric fields in this range may produce a pressure in the range of about 0 Pa to about 10 MPa. In order for the transducer to produce greater forces, the thickness of the polymer layer may be increased. Actuation voltages for a particular polymer may be reduced by increasing the dielectric constant, decreasing the polymer thickness, and decreasing the modulus of elasticity, for example.

In one embodiment, polymer 12 is compliant and selected based on its elastance. A modulus of elasticity for polymer 12 less than about 100 MPa is suitable for many embodiments. In one specific embodiment, electroactive polymer 12 includes an elastic modulus less than 40 MPa. In another specific embodiment, electroactive polymer 12 is relatively compliant and includes an elastic modulus less than 10 MPa.

Transducers and polymers of the present invention are not limited to any particular geometry or type of deflection. For example, the polymer and electrodes may be formed into any geometry or shape including tubes and rolls, stretched polymers attached between multiple rigid structures, stretched polymers of any geometry maintained by techniques described herein—including curved or complex geometry's, across a frame having one or more joints, etc. Deflection of a transducer according to the present invention may include linear expansion and/or compression in one or more directions, bending, axial deflection when the polymer is rolled, deflection out of a hole provided in a substrate, etc. Deflection of a transducer may be affected by how the polymer is constrained by a frame, rigid structures attached to the polymer, or stiffened portions of the polymer (e.g., via curing or a laminate). In a specific embodiment, a flexible material that is stiffer in elongation than the polymer is attached to one side of a transducer induces bending when the polymer is actuated.

Linear strain and area strain may be used to describe the deflection of a pre-strained polymer. As the term is used herein, linear strain of a pre-strained polymer refers to the deflection per unit length along a line of deflection relative to the unactuated state. Maximum linear strains (tensile or compressive) of at least about 50 percent are common for pre-strained polymers of the present invention. Of course, a polymer may deflect with a strain less than the maximum, and the strain may be adjusted by adjusting the applied voltage. For some pre-strained polymers, maximum linear strains of at least about 100 percent are common. For polymers such as VHB 4910 as produced by 3M Corporation of St. Paul, Minn., maximum linear strains in the range of 40 to 215 percent are common. Area strain of an electroactive polymer refers to the change in planar area, e.g. the change in the plane defined by directions 108 and 110 in FIGS. 1A and 1B, per unit area of the polymer upon actuation relative to the unactuated state. Maximum area strains of at least about 100 percent are possible for pre-strained polymers of the present invention. For some pre-strained polymers, maximum area strains in the range of 70 to 330 percent are common.

As electroactive polymers of the present invention may deflect at high strains, electrodes attached to the polymers should also deflect without compromising mechanical or electrical performance. Generally, electrodes suitable for use with the present invention may be of any shape and material provided that they are able to supply a suitable voltage to, or receive a suitable voltage from, an electroactive polymer. The voltage may be either constant or varying over time. In one embodiment, the electrodes adhere to a surface of the polymer. Electrodes adhering to the polymer may be compliant and conform to the changing shape of the polymer. The electrodes may be only applied to a portion of an electroactive polymer and define an active area according to their geometry. As will be described below, the electrodes may also be patterned to achieve a desired shape for a surface feature created by deflection of the polymer.

In one embodiment, electrodes 14 and 16 are compliant and conform to the shape of an electroactive polymer to which they are attached. Referring back to FIGS. 1A and 1B, the configuration of polymer 12 and electrodes 14 and 16 provides for increasing polymer 12 response with deflection. More specifically, as the transducer portion 10 deflects, compression of polymer 12 brings the opposite charges of electrodes 14 and 16 closer and the stretching of polymer 12 separates similar charges in each electrode. In one embodiment, one of the electrodes 14 and 16 is ground.

Various types of electrodes suitable for use with the present invention are described in commonly owned, copending U.S. patent application Ser. No. 09/619,848, which is incorporated by reference herein for all purposes. Electrodes described therein and suitable for use with the present invention include structured electrodes comprising metal traces and charge distribution layers, textured electrodes, conductive greases such as carbon greases or silver greases, colloidal suspensions, high aspect ratio conductive materials such as carbon fibrils and carbon nanotubes, and mixtures of ionically conductive materials. The present invention may also employ metal and semi-inflexible electrodes. In one embodiment, the metal is disposed in thin sheets such that the metal layer, like tin foil for example, is flexible out-of-plane but relatively rigid in plane. Another flexible out-of-plane but relatively rigid in plane electrode may comprise a sheet of aluminized mylar. In another embodiment, the metal is disposed in thick sheets such that the metal layer is rigid and restrains the polymer from deflection on the attached surface.

Materials used for electrodes of the present invention may vary. Suitable materials used in an electrode may include graphite, carbon black, colloidal suspensions, thin metals including silver and gold, silver filled and carbon filled gels and polymers, gelatin, and ionically or electronically conductive polymers. In a specific embodiment, an electrode suitable for use with the present invention comprises 80 percent carbon grease and 20 percent carbon black in a silicone rubber binder such as Stockwell RTV60-CON as produced by Stockwell Rubber Co. Inc. of Philadelphia, Pa. The carbon grease is of the type such as NyoGel 756G as provided by Nye Lubricant Inc. of Fairhaven, Mass. The conductive grease may also be mixed with an elastomer, such as silicon elastomer RTV 118 as produced by General Electric of Waterford, N.Y., to provide a gel-like conductive grease.

It is understood that certain electrode materials may work well with particular polymers and may not work as well for others. For most transducers, desirable properties for the compliant electrode may include one or more of the following: low modulus of elasticity, low mechanical damping, low surface resistivity, uniform resistivity, chemical and environmental stability, chemical compatibility with the electroactive polymer, good adherence to the electroactive polymer, and the ability to form smooth surfaces. In some cases, a transducer of the present invention may implement two different types of electrodes, e.g., a different electrode type for each active area or different electrode types on opposing sides of a polymer.

Electronic drivers are typically connected to the electrodes. The voltage provided to an electroactive polymer will depend upon specifics of a transducer and application. In one embodiment, a transducer of the present invention is driven electrically by modulating an applied voltage about a DC bias voltage. Modulation about a bias voltage allows for improved sensitivity and linearity of the transducer to the applied voltage. For example, a transducer used in an audio application may be driven by a signal of up to 200 to 1000 volts peak to peak on top of a bias voltage ranging from about 750 to 2000 volts DC.

Figure 1C:
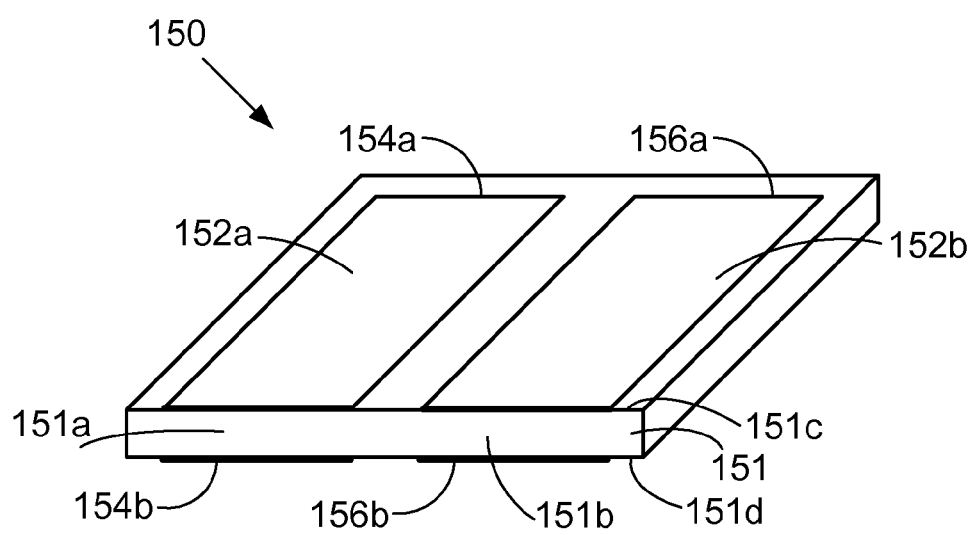
FIG. 1C illustrates a monolithic transducer comprising a plurality of active areas in accordance with one embodiment of the present invention.

In accordance with the present invention, the term "monolithic" is used herein to refer to electroactive polymers, transducers, and devices comprising a plurality of active areas on a single polymer. FIG. 1C illustrates a monolithic transducer 150 comprising a plurality of active areas in accordance with one embodiment of the present invention. The monolithic transducer 150 converts between electrical energy and mechanical energy. The monolithic transducer 150 comprises an electroactive polymer 151 having two active areas 152a and 152b.

Active area 152a has top and bottom electrodes 154a and 154b that are attached to polymer 151 on its top and bottom surfaces 151c and 151d, respectively. The electrodes 154a and 154b provide a voltage difference across a portion 151a of polymer 151. The portion 151a deflects with a change in electric field provided by the electrodes 154a and 154b. More specifically, portion 151a expands in the plane and thins vertically—or orthogonal to the plane—with a suitable voltage difference across a portion 151a. The portion 151a comprises the polymer 151 between the electrodes 154a and 154b and any other portions of the polymer 151 having sufficient stress induced by the electrostatic force to enable deflection and thinning upon application of voltages using the electrodes 154a and 154b.

Active area 152b has top and bottom electrodes 156a and 156b that are attached to the polymer 151 on its top and bottom surfaces 151c and 151d, respectively. The electrodes 156a and 156b provide a voltage difference across a portion 151b of polymer 151. The portion 151b deflects with a change in electric field provided by the electrodes 156a and 156b. More specifically, portion 151a expands in the plane and thins vertically—or orthogonal to the plane—with a suitable voltage difference across a portion 151a. The portion 151b comprises polymer 151 between the electrodes 156a and 156b and any other portions of the polymer 151 having sufficient stress induced by the electrostatic force to enable deflection upon application of voltages using the electrodes 156a and 156b.

Active areas 152a and 152b permit independent control via their respective electrodes. Thus, in conjunction with suitable control electronics, active areas 152a and 152b may be actuated individually, simultaneously, intermittently, etc.

So far, electrodes on opposite surfaces of an electroactive polymer described so far have been symmetrical in size, shape and location. Electrodes on opposite sides of a transducer of the present invention are not limited to symmetrical designs or layouts and may have different sizes, shapes, types, and/or locations on opposite surfaces of an electroactive polymer. Electrodes on a polymer may be patterned as desired. For example, one or more electrodes may be sprayed onto a surface of a polymer in the shape determined by a mask or stencil. Different masks may be used for each polymer surface. Customized electrode shape allows customized deflections from a polymer portion. Control of electrodes for each active area then allow each custom-patterned active area to be activated individually, simultaneously, intermittently, etc.

Electroactive Polymer Pre-Strain

Electroactive polymer 12—or one or more portions thereof—is pre-strained. The performance of many polymers is notably increased when the polymers are pre-strained in area. For many polymers, pre-strain improves conversion between electrical and mechanical energy. The improved mechanical response enables greater mechanical work for an electroactive polymer, e.g., larger deflections and actuation pressures. In one embodiment, pre-strain improves the dielectric strength of the polymer. For example, a 10-fold to 25-fold increase in area significantly improves performance of many electroactive elastomers.

In one embodiment, the pre-strain is elastic. In principle, an elastically pre-strained polymer may have any forces or alterations that maintain the pre-strain removed and return to its original unstrained state.

The pre-strain may comprise elastic deformation of polymer 12 and be formed, for example, by stretching the polymer in tension and applying one or more of the techniques described herein while the polymer is stretched. In one embodiment, portions of an electroactive polymer, or a polymer precursor added to the polymer, are cured or otherwise stiffened to increase their stiffness and hold pre-strain for one or more portions of a polymer. This allows pre-strain to be held without an external frame. The present invention may also employ one or more stiff layers laminated onto the polymer to maintain pre-strain for one or more portions of the polymer.

Pre-strain of a polymer may be described, in one or more directions, as the change in dimension in a direction after pre-straining relative to the dimension in that direction before pre-straining. In one embodiment, pre-strain is applied uniformly over a portion of polymer 12 to produce an isotropic pre-strained polymer. By way of example, an acrylic elastomeric polymer may be stretched by 200 to 400 percent in both planar directions 18 and 20 (FIG. 1A). In another embodiment, pre-strain is applied unequally in different directions for a portion of polymer 12 to produce an anisotropic pre-strained polymer. In this case, polymer 12 may deflect greater in one direction than another when actuated. While not wishing to be bound by theory, it is believed that pre-straining a polymer in one direction may increase the stiffness of the polymer in the pre-strain direction. Correspondingly, the polymer is relatively stiffer in the high pre-strain direction and more compliant in the low pre-strain direction and, upon actuation, more deflection occurs in the low pre-strain direction. In one embodiment, deflection in direction 18 of transducer portion 10 may be enhanced by employing a large pre-strain in perpendicular direction 20. For example, an acrylic elastomeric polymer used as the transducer portion 10 may be stretched by 10 percent in direction 18 and by 500 percent in the perpendicular direction 20.

The quantity of pre-strain for a polymer may be based on the electroactive polymer material and a desired performance of the electroactive polymer transducer in an actuator, generator, sensor or application. For some polymers of the present invention, pre-strain in one or more directions may range from −100 percent to 600 percent. By way of example, for a VHB acrylic elastomer having isotropic pre-strain, pre-strains of at least about 100 percent, and preferably between about 200-400 percent, may be used in each direction. In one embodiment, the polymer is pre-strained by a factor in the range of about 1.5 times to 50 times the original area. For an anisotropic acrylic pre-strained to enhance actuation in a compliant direction, pre-strains between about 400-500 percent may be used in the stiffened direction and pre-strains between about 20-200 percent may be used in the compliant direction. In some cases, pre-strain may be added in one direction such that a negative pre-strain occurs in another direction, e.g. 600 percent in one direction coupled with −100 percent in an orthogonal direction. In these cases, the net change in area due to the pre-strain is typically positive. Pre-strain suitable for use with the present invention is further described in commonly owned, U.S. Pat. No. 6,545,384, which is incorporated by reference in its entirety for all purposes.

Pre-strain may affect other properties of the polymer 12. Large pre-strains may change the elastic properties of the polymer and bring it into a stiffer regime with lower viscoelastic losses. For some polymers, pre-strain increases the electrical breakdown strength of the polymer 12, which allows for higher electric fields to be used within the polymer-permitting higher actuation pressures and higher deflections.

The pre-strain may be imposed for substantially the entire polymer or may also be implemented locally for a portion of the polymer. Different portions of the polymer may also include different pre-strains, as will be described below (e.g., FIG. 2C).

Exemplary Pre-Strain Configurations

The present invention maintains pre-strain for one or more portions of an electroactive polymer using a stiffened portion of the polymer and/or a laminate. There are countless configurations for an electroactive polymer, transducer or device having a stiffened portion shaped as a frame or one or more structural support portions that maintains pre-strain for a polymer or portion thereof. Numerous examples of frames and structural elements for electroactive polymer devices are further described in commonly owned U.S. Pat. No. 6,545, 384, which was incorporated by reference above. Several exemplary electroactive polymer configurations are now provided to facilitate discussion.

Figure 2A:
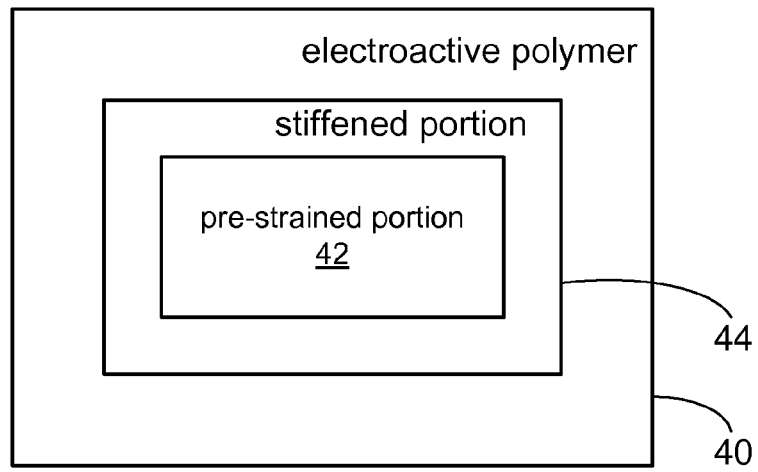
FIG. 2A illustrates an electroactive polymer comprising a pre-strained portion and a stiffened portion in accordance with one embodiment of the present invention.

FIG. 2A illustrates an electroactive polymer 40 comprising a pre-strained portion 42 and a stiffened portion 44 in accordance with one embodiment of the present invention. Pre-strained portion 42 includes a portion of polymer 40 that includes pre-strain, such as an anisotropic and/or elastic pre-strain.

Stiffened portion 44 is configured to maintain pre-strain in the pre-strained portion 42. Stiffened portion 44 serves as a structural element that holds and maintains pre-strain in pre-strained portion 42. More specifically, stiffened portion 44 is configured to provide forces that oppose elastic contraction forces in the stretched pre-strained portion 42 generated when pre-strained portion 42 was stretched to attain its pre-strain. Stiffened portion 44 thus provides mechanical stability for polymer 40. As shown, stiffened portion 44 comprises a rectangular window that perimetrically borders pre-strained portion 42.

Stiffened portion 44 comprises a portion of polymer 40 having a greater stiffness than pre-strained portion 42 (or is less compressible). In one embodiment, stiffened polymer portion comprises an elastic modulus greater than about 10 MPa. In another embodiment, stiffened polymer portion comprises an elastic modulus greater than about 50 MPa.

In one embodiment, stiffened portion 44 comprises a polymer component that was cured while electroactive polymer 40 was pre-strained to at least partially maintain the pre-strain in pre-strained portion 42. As will be described in further detail below, stiffened portion 44 may also be formed via curing polymer 40 in the area designated by stiffened portion 44 as shown, curing a polymer precursor included in the area designated by stiffened portion 44, or laminating a support layer onto the area designated by stiffened portion 44.

One or more electrodes may be disposed on both surfaces of pre-strained portion 42 to create an active area within stiffened portion 44. FIG. 3B illustrates a stretched film actuator where electrodes 275 and 276 are patterned on a top and bottom surface of pre-strained portion 273 within a frame 271 cured into the polymer. In this case, pre-strained portion polymer 273 does not need to include the mechanism used to stiffen frame 271. For example, if a polymer precursor is cured to stiffen frame 271, pre-strained portion polymer 273 may not include the polymer precursor or may include the polymer precursor without significant curing.

In one embodiment, electroactive polymer 40 comprises a compliant electroactive polymer film and a support polymer formed in or on the compliant electroactive polymer film that defines the stiffened polymer portion 44. Techniques for forming the support polymer, such as curing, are described below.

Stiffened portion 44 provides 'in-situ' but separate mechanical support for pre-strained portion 42. That is, electroactive polymer 40 does not include an external frame or an external mechanism configured to maintain pre-strain in pre-strained portion 42, and instead relies on portions of polymer 40 having increased stiffness. This simplifies manufacture of transducers and devices employing polymer 40 and increases the power density of the transducers and devices.

As opposed to separating the stiffened portion and the pre-strained portion as in FIG. 2A, the present invention may also stiffen portions of electroactive polymer (or an entire polymer) to create pre-strained portions that include stiffening. In this case, the stiffened portions locally support the pre-strain and the common pre-strained/stiffened portions are intended to deflect. Thus, the stiffened portions lock in pre-strain while letting the common stiffened/pre-strained portions areas still move. This advantageously provides polymer sheets that include pre-strain but eliminate the need for a frame to hold the polymer to maintain pre-strain. A frame may still be used for other reasons, such as to couple to the polymer in a device, but the stresses applied onto the polymer from the frame in holding the pre-strain are eliminated. This creates a polymer, or portions thereof, that include pre-strain but no stresses in the polymer for holding the pre-strain.

Figure 2B:
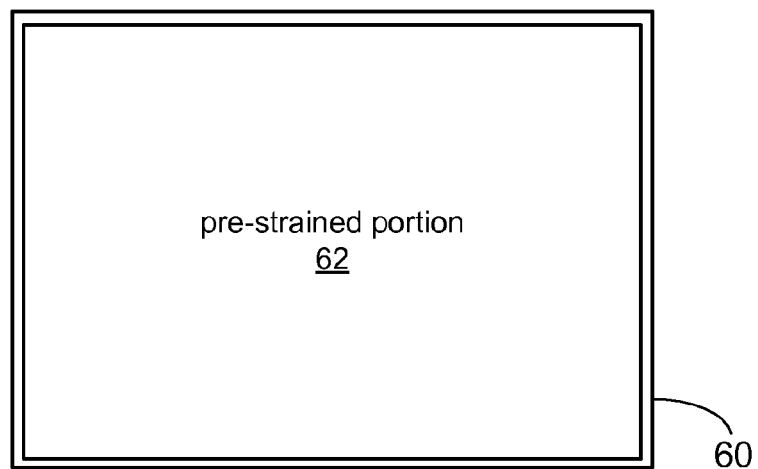
FIG. 2B illustrates an electroactive polymer comprising a pre-strained portion that corresponds to a stiffened portion in accordance with one embodiment of the present invention.

FIG. 2B illustrates an electroactive polymer 60 comprising a pre-strained portion 62 that corresponds to a stiffened portion 64 in accordance with one embodiment of the present invention. As shown, stiffened portion 64 comprises substantially the entire electroactive polymer 60. In addition, pre-strained portion 62 coincides in surface area with stiffened portion 64 and comprises substantially the entire electroactive polymer 60. In this case, portions of polymer 60 that have been stiffened maintain the pre-strain internally. In other words, pre-strain portion 62 has been stiffened to provide forces that oppose elastic contraction forces in the stretched pre-strained portion 62 generated when pre-strained portion 62 was stretched to attain its pre-strain.

In one embodiment, stiffened portion 64 comprises an electroactive polymer that was cured while the entire polymer 60 was stretched to attain a desired stiffness, compliance or pre-strain level. In this case, the common stiffened portion 64/pre-strained portion 62 may include all portions of polymer 60 that were cured save those needed to hold the polymer that were inaccessible to the cure since they were used to hold the pre-strain in fabrication (e.g., those that were not visible to a radiation cure). For a thermal cure, the common stiffened portion 64/pre-strained portion 62 may include the entire polymer 60.

In another embodiment, stiffened portion 64 comprises a polymer component that was added to the entire electroactive polymer 60 and cured while the entire polymer 60 was stretched. Again, this may exclude portions that were inaccessible to adding the polymer component. Patterning using a mask when adding the polymer component or pattering with a mask in the cure may be used to create custom sized pre-strained portions 62. Alternatively, the polymer component may be added to the entire polymer 60 and the entire polymer cured (e.g., thermally in an oven) to pre-strain and stiffen the entire polymer 60.

Curing a polymer precursor may also form pre-strained portion 62 (whether the whole polymer 60 or a portion thereof). Again, patterning using a mask when adding the polymer precursor or pattering with a mask in the cure may be used to create custom sized pre-strained portions 62. Or the entire polymer may be pre-strained and stiffened in this manner, e.g., create a stiffened portion that resembles pre-strained portion 62 and polymer 60 dimensions.

Curing a precursor for a support polymer mixed in a composition comprising a precursor for an electroactive polymer and a precursor for a support polymer may also form pre-strained portion 62. In one embodiment, the cured composition technique stiffens the entire polymer 60 and creates a stiffened portion that comprises the entire electroactive polymer with substantially uniform pre-strain properties.

Pre-strain also shown in FIG. 2B may also increase breakdown voltage for the polymer. This improves polymer use as insulation and a capacitor than the same polymer without pre-strain. In addition, polymer 60 includes no applied pre-strain stresses at the actuator level resulting from use of a frame to support the pre-strain. Although FIG. 2B illustrates a stiffened portion 64 that spatially coincides with the size of the entire polymer 60, it is understood that smaller portions of 60 may include pre-strained portions that coincide in surface area with stiffened portion. For example, a mask may be used to create the shapes shown in FIG. 2C (with no bordering support portions).

Figure 2C:
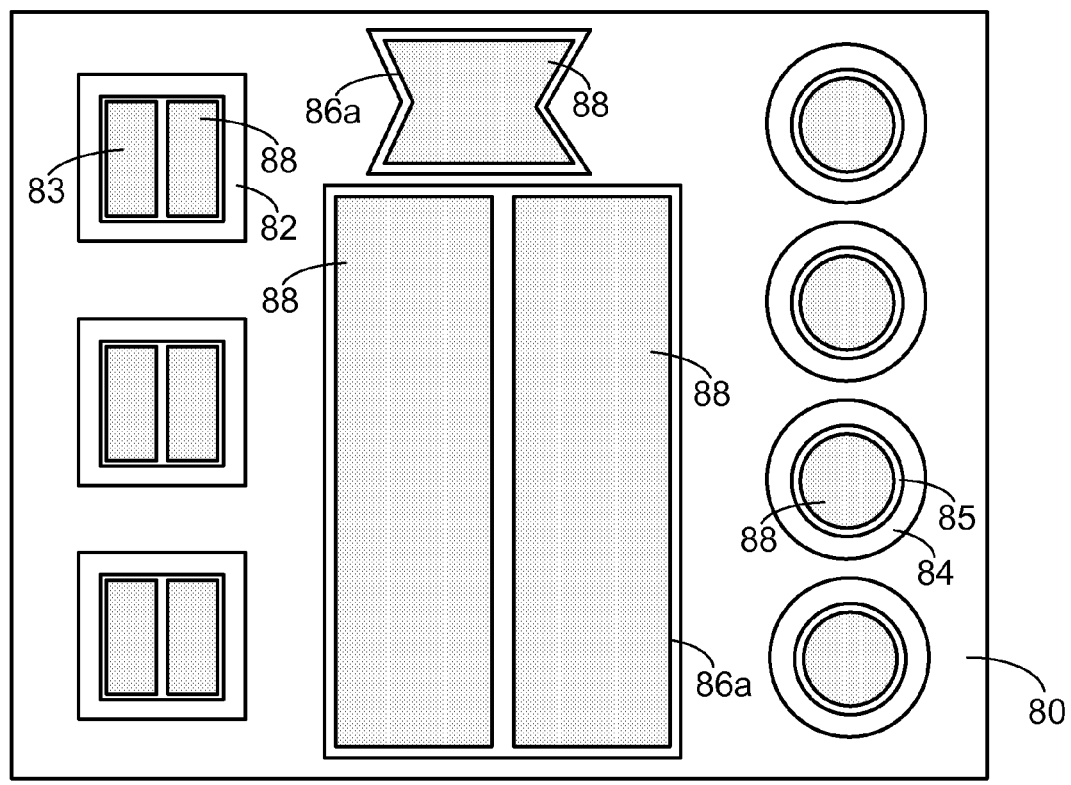
FIG. 2C illustrates an electroactive polymer comprising a multiple stiffened regions patterned on a single polymer in accordance with one embodiment of the present invention.

FIG. 2C illustrates an electroactive polymer 80 comprising a multiple stiffened regions 82, 84 and 86 patterned on a single polymer in accordance with one embodiment of the present invention. Stiffened portions 82 border and maintain pre-strain for square pre-strained portions 83, while stiffened portions 84 border and maintain pre-strain for circular pre-strained portions 85. Pre-strained portions 86 include stiffened portions that spatially coincide with the pre-strained portions 86 and comprise less rigidity than stiffened portions 82 and 84 so as to permit deflection of the common pre-strained portions/stiffened portion 86.

Polymer 80 permits batch manufacture of multiple electroactive polymer transducers and simplifies manufacture of transducers and devices comprising pre-strained portions 83 and 85 and their respective stiffened regions. Patterning numerous stiffened regions 82 and 84 using a photo cure single mask, for example, permits one stretching action for the entire electroactive polymer 80 to achieve pre-strain for the entire polymer and all pre-strained portions 83, 85 and 86 formed thereon. Photo curing the different portions to greater and lesser extents may then produce the desired stiffness in each portion. For example, pre-strained portion 86a may include increased curing and stiffening, thus producing a stiffer polymer and increased pre-strain in portion 86a, relative to portion 86b which comprises less curing and stiffening, thus producing a softer polymer and decreased pre-strain in portion 86b.

In one embodiment, stiffened region 82 comprises a greater stiffness than stiffened region 84. Several techniques for differential stiffness are described below. For example, stiffened region 82 may comprise a large stiffness that fully maintains pre-strain imposed on pre-strained portion 83, while stiffened region 84 may comprise a smaller stiffness that partially maintains pre-strain imposed on pre-strained portion 83, e.g., maintains half the pre-strain in each direction. When polymer 80 includes a consistent pre-strain throughout, this differential stiffness creates regions on a single electroactive polymer with differential pre-strain. Thus, electroactive polymer 80 comprises a pre-strained portion 83 having a greater pre-strain than the second pre-strained portion 85.

Each pre-strained portion and stiffened portion may be formed using a suitable mask or etch technique. Each pre-strained portion 85 and stiffened portion 84 may be used in a diaphragm actuator, for example. The diaphragm actuators include stiff portions 84 and polymer that spans a hole in the stiff portion 84 covered with an electrode 88. Each pre-strained portion 83 and stiffened portion 82 may be used in a stretched film actuator (FIG. 3B), for example. Pre-strained portion 86b may be used in a rolled electroactive polymer actuator, generator or sensor. Pre-strained portion 86a may be used in a linear bowtie actuator. Each pre-strained portion may be punch cut from polymer 80 to progress individual manufacturing for each polymer portion. Separation of each pre-strained portion from polymer may occur before or after electrodes have been added. As shown, electrodes 88 have been added to each pre-strained portion.

Although electroactive polymer 80 is illustrated with different pre-strained portion shapes, it is understood that each pre-strained portion for a single polymer may include that same shape. In this case, anisotropic pre-strain may be applied to the entire polymer 80 and each portion patterned thereon. In one embodiment, pre-strained portion 83 and pre-strained portion 85 each comprise a polymer component that has been cured, at least partially, to stiffen each portion. Applying a mask during curing may then customize the shape, size and stiffness (the mask includes selective permeability to the curing energy) for each portion on polymer 80. In another embodiment, electroactive polymer 80 comprises a compliant electroactive polymer film and a support polymer formed in or on the compliant electroactive polymer film. In this case, the amount of support polymer applied to different portions of polymer and permitted to diffuse into the polymer is varied to control the stiffness or pre-strain level for a portion. For example, pre-strained portion 85 may comprise a greater concentration of the support polymer than pre-strained portion 83.

Figure 3A:
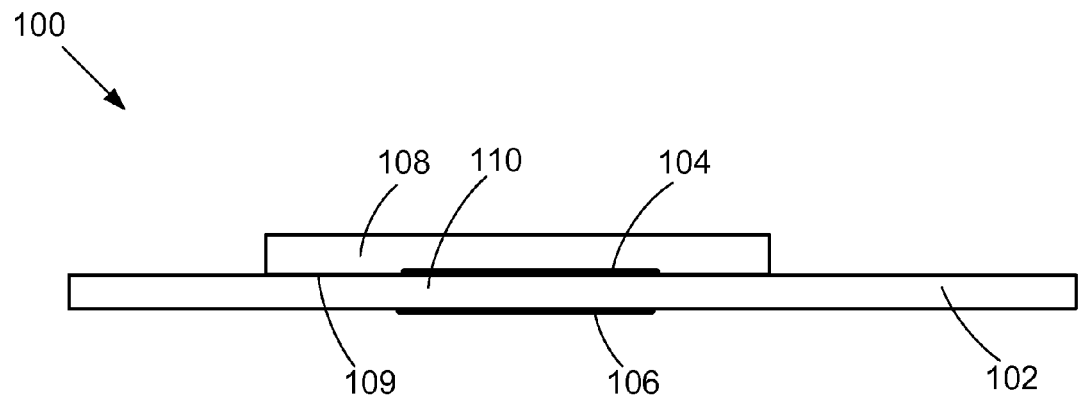
FIG. 3A illustrates an electroactive polymer transducer for converting between electrical and mechanical in accordance with one embodiment of the present invention.
Figure 3B:
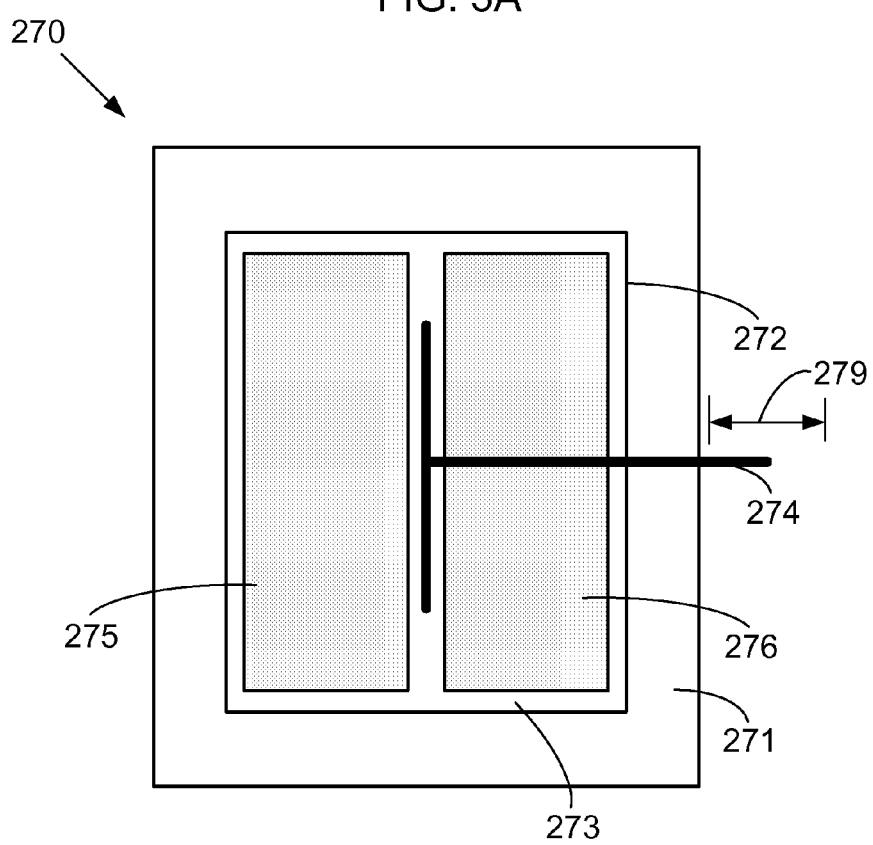
FIG. 3B illustrates a stretched film actuator in accordance with one embodiment of the present invention.

FIG. 3A illustrates an electroactive polymer transducer 100 for converting between electrical and mechanical in accordance with one embodiment of the present invention. Transducer 100 comprises polymer 102, electrodes 104 and 106 and support layer 108. Electroactive polymer 102 is in conductive electrical communication with electrodes 104 and 106 and includes a pre-strained portion 110.

Support layer 108 is coupled to a surface portion 109 of the electroactive polymer 102 and configured to maintain pre-strain in portion 110. Support layer 108 serves as a structural element that holds and maintains pre-strain in pre-strained portion 110. More specifically, support layer 108 provides forces that oppose elastic contraction forces in the stretched pre-strained portion 110. Support layer is also configured to deflect with deflection of electroactive polymer 102. Thus, while support layer 108 includes a suitable stiffness to maintain pre-strain in portion 110, it is understood that support layer 108 is compliant enough to comply with actuation or other deflection of polymer 102.

The stiffness for support layer 108 may be chosen to achieve an aggregate stiffness for the combined layer 108 and polymer 102. In one embodiment, the combined layer 108 and polymer 102 possess an elastic modulus less than about 10 MPa. Stiffness for support layer 108 may be tuned to match the stiffness for polymer 102. It is understood that the stiffness provided by support layer 108 is dependent on the elastic modulus for support layer 108 and the layer 108 thickness. In one embodiment, support layer 108 comprises a greater stiffness than polymer 102. In a specific embodiment, support layer 108 comprises an elastic modulus greater than about 50 MPa. In this case, thickness of layer 108 may be reduced when increased deflection for an electrical input is desired. In another embodiment, support layer 108 is relatively soft to increase electrically-induced strain and comprises an elastic modulus less than about 10 MPa.

Surface portion 109 represents an area on a surface of polymer 102 that contacts support layer 108. As shown, support layer 108 overlaps pre-strained portion 110. Overlapping between support layer 108 and pre-strained portion 110 refers to at least partial intersection on a surface of polymer 102 between support layer 108 and portion 110. Typically, this is taken from a surface area view and it is understood that both the support layer 108 and portion 110 may not be visible. Support layer 108 also overlaps electrode 104. In one embodiment, support layer 108 extends beyond electrode 104 and attaches to the polymer outside electrode 104 (or overlaps other electrodes corresponding to multiple active areas on the polymer). In a specific embodiment, support layer 108 resembles the shape of polymer portion or electrode it covers. As polymer portions and electrodes of an electroactive polymer transducer may include custom shapes such as geometric shapes, surface portion 109 may thus resemble a geometric shape that matches the surface shape of the polymer portion or electrode.

Coupling between support layer 108 and the surface of polymer 102 may comprise lamination, attachment using a suitable adhesive based on the materials being bonded, attachment through an intermediate layer such as an adhesive layer, etc. Lamination may comprise any suitable chemical bonding between the two surfaces as determined by the two materials being bonded. In one embodiment, support layer 108 comprises the same material as polymer 102 to facilitate lamination therebetween. In this case, support layer 108 is disposed onto polymer 102 in a different stress that overcomes at least balances elastic contraction forces in the stretched pre-strained portion 110.

In one embodiment, support layer 108 comprises an electrical resistance less than that of the electroactive polymer. The resistance may be low enough to achieve reasonable charging time for an application and conductive enough in the presence of parasitic leakage (e.g. through the air). In this case, support layer 108 support layer can be configured as an electrode for the transducer.

FIG. 3B illustrates a stretched film actuator 270 for providing linear deflection in accordance with another embodiment of the present invention. The stretched film actuator 270 includes a stiffened polymer frame portion 271 having a hole 272. Stiffened polymer frame portion 271 maintains pre-strain for a pre-strained polymer portion 273 that rests in tension and spans hole 272. A rigid bar 274 attaches to a central region of the polymer portion 273 and provides external displacement corresponding to deflection of the polymer portion 273. Compliant electrodes pairs 275 and 276 are patterned on both top and bottom surfaces of the polymer portion 273 on the left and right sides, respectively, of the rigid bar 274. When the electrode pair 275 is actuated, an active area for electrode pair 275 expands and moves rigid bar 274 to the right. Conversely, when the electrode pair 276 is actuated, an active area for electrode pair 276 expands and moves rigid bar 274 to the left. Alternating actuation of the electrodes 275 and 276 provides an effectively larger total stroke 279 for the rigid bar 274. One variation of this actuator includes adding anisotropic pre-strain to the polymer portion 273 such that the polymer portion 273 has high pre-strain (and stiffness) in the direction perpendicular to the rigid bar displacement. Another variation is to eliminate one of the electrode pairs 275 and 276.

Figure 3C:
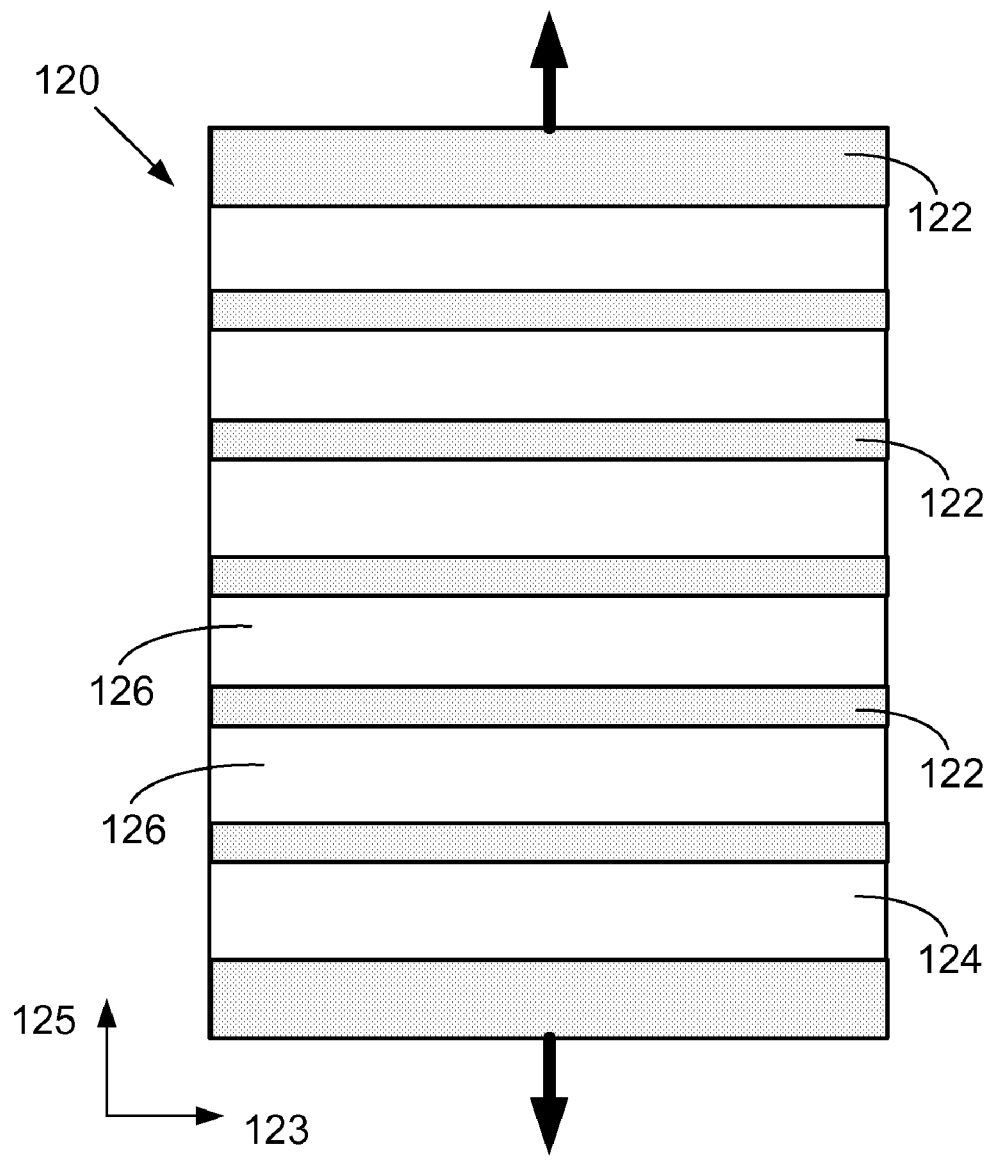
FIG. 3C illustrates an electroactive polymer transducer comprising linear segments that affect deflection in accordance with a specific embodiment of the present invention.

In another embodiment, a portion of an electroactive polymer is stiffened to affect a direction of deflection. FIG. 3C illustrates an electroactive polymer transducer 120 comprising stiff segments 122 that affect deflection in accordance with a specific embodiment of the present invention.

Stiff segments 122 comprise laminates or stiffened portions of polymer 124 arranged on polymer 124 while the polymer is in a pre-strained state, e.g. while it is stretched. Pre-strained portions 126 are formed between segments 122. Stiff segments 122 are characterized by a primary direction 123 and decrease deflection of the pre-strained portion in the primary direction 123. The stiffeners 122 also maintain pre-strain for portions 126 along the axis of segments 122 in direction 123. In addition, stiffeners 122 permit deflection only in orthogonal direction 125. It should be noted that the increased stiffness in direction 123 comprises the increased stiffness provided by segments 122 as well as the increased stiffness of polymer in the pre-strain direction 123.

As shown, numerous stiff segments 122 are arranged in parallel and permit an increased cumulative output in direction 125. Stiff segments 122 may be arranged in other configurations to achieve directional compliance of transducer 120, such as radial segments for example. Stiff segments 122 may be acquired using stiffened portions of polymer 124 (e.g., by curing) or one or more laminates disposed where stiff segments 122 are shown.

Dual Cure Pre-Strain Fabrication

As the pre-strained polymers may be implemented both in the micro and macro scales, in a wide variety of actuator designs, with a wide range of materials, and in a broad range of applications, fabrication processes used with the present invention may vary greatly. In one aspect, the present invention provides methods for fabricating electroactive polymers and electroactive polymer transducers and devices including one or more pre-strained polymers.

In one embodiment, the present invention applies pre-strain to a partially cured electroactive polymer. The partially cured polymer is then further cured to support and maintain the pre-strain. This technique is useful when the electroactive polymer comprises one or more reactive groups and curing may result in crosslinking of the polymer chains and provide support for the pre-strain.

Figure 4:
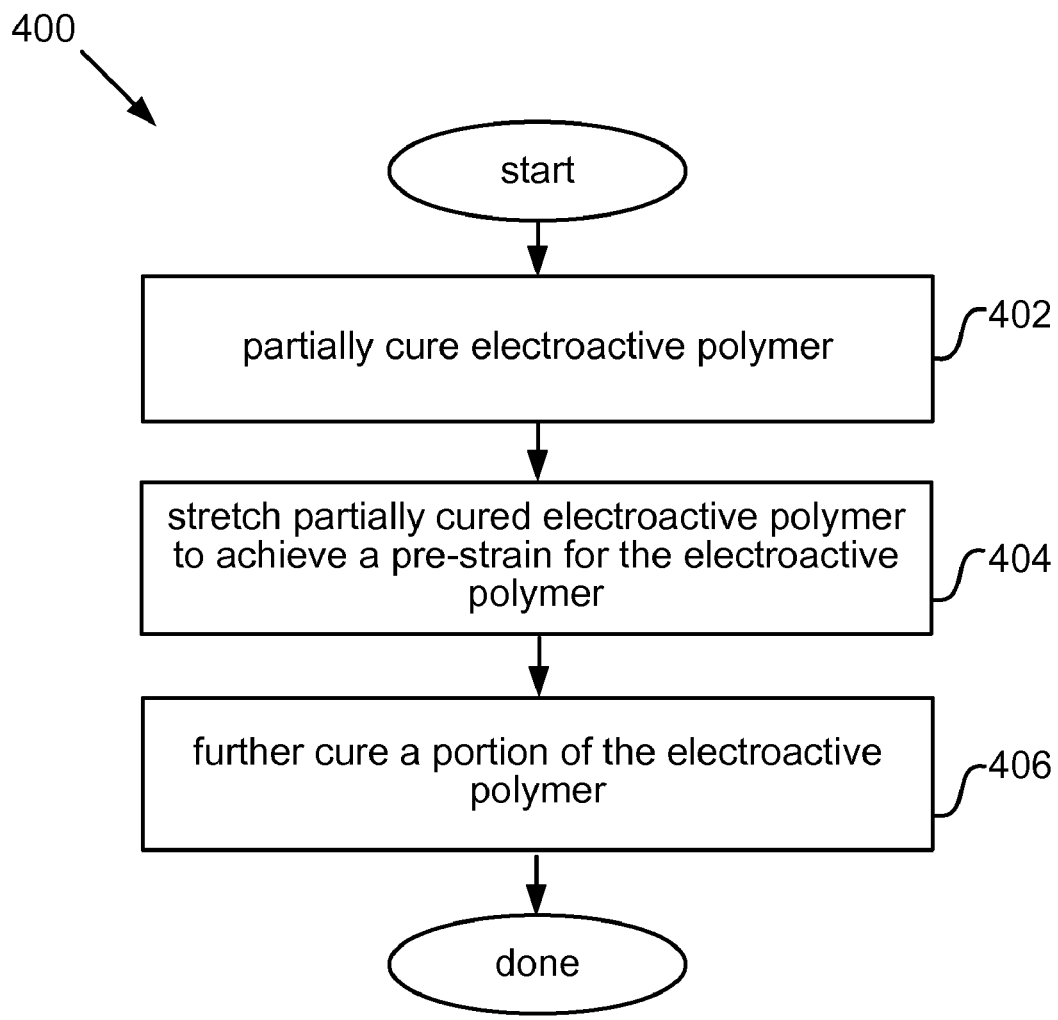
FIG. 4 illustrates a dual cure process flow for forming an electroactive polymer in accordance with one embodiment of the present invention.

FIG. 4 illustrates a dual cure process flow 400 for forming an electroactive polymer in accordance with one embodiment of the present invention. Processes in accordance with the present invention may include up to several additional steps not described or illustrated here in order not to obscure the present invention. In some cases, fabrication processes of the present invention may include conventional materials and techniques such as commercially available polymers and techniques used in fabrication of microelectronics and electronics technologies. In addition, fabrication of devices employed electroactive polymers described herein may include additional steps not detailed in order not to obscure the present invention. For example, micro diaphragm actuators may be produced in situ on silicon using conventional techniques to form the holes and apply the polymer and electrodes.

Process flow 400 begins by partially curing a composition comprising a precursor for an electroactive polymer to form a partially cured electroactive polymer (402). In one embodiment, the electroactive polymer is partially cured until the polymer possesses a mechanical integrity suitable for elastically stretching the partially cured electroactive polymer. Curing may be performed thermally, photochemically, or with radiation for example. Thermal curing may be employed without the addition of any chemical agents, or upon the addition of a suitable initiating agent or one or more additional curing agents. The thermal curing may be carried out in a conventional oven, for example. The polymerizable groups in the electroactive polymer precursor may undergo a chain-growth polymerization (such as that in compounds containing carbon-carbon double bonds), a ring-opening polymerization (such as that in epoxies, tetrahydrofurans, lactones, lactams, and alicyclics), or step-growth polymerization (such as that in the formation of polyesters, polyamides, polyimides, and polyurethanes).

The partially cured electroactive polymer is then stretched to achieve a pre-strain for the electroactive polymer (404). Pre-strain may be achieved by a number of techniques. In one embodiment, pre-strain is achieved by mechanically stretching a polymer in one or more directions and temporarily fixing it to one or more solid members (e.g., rigid plates or a manufacturing frame) while stretched. The polymer may alternatively be held temporarily in pre-strain using a suitable rigid substrate, e.g. by stretching the polymer and then attaching it to the rigid substrate. Suitable anisotropic and elastic pre-strain quantities were described above.

Process flow 400 then proceeds by further curing a portion of the electroactive polymer to stiffen the portion (or entire polymer) (406). After curing, the stiffened portion comprises a polymer component that was cured while the electroactive polymer was strained in order to lock in or maintain the pre-strain. The polymer component may comprise the electroactive polymer or a separate additive such as a polymer precursor described below. In another embodiment, the electroactive polymer comprises a compliant electroactive polymer film and a support polymer formed in or on the compliant electroactive polymer film. Curing of the support polymer stiffens the portion. The second curing may be performed thermally, photochemically, or with radiation for example. The polymerizable groups in the electroactive polymer precursor (or partially formed/cured polymer chains/networks) may further undergo a chain-growth polymerization, a ring-opening polymerization, or step-growth polymerization. Further, existing polymer chains may be cross-linked (or further cross-linked beyond some existing cross-link state) to effect the curing/stiffening. Generally, the stiffened portion may comprise any polymer precursor that when cured (by chain growth or cross-linking), at least partially, stiffens the electroactive polymer material in the portion.

The use of curing mechanisms permits the stiffness and force output of a polymer to be increased. The maximum actuated strain may reduce with increasing stiffness, but higher force output is useful in many applications. In one embodiment, a cured portion possesses an elastic modulus less than about 10 MPa after curing when the portion is employed for actuation. The polymer may also be cured to a desired stiffness, and may also be cured to attain another property, such as a desired thickness after releasing from the pre-strain frame. In another embodiment, the stiffened portion is further cured when it is employed to maintain pre-strain in a neighboring portion of the polymer. For example, the stiffened portion may be further cured to possess an elastic modulus above 50 MPa when it is employed to maintain pre-strain in a neighboring portion of the polymer.

The second curing may comprise exposing the electroactive polymer to radiation such as ultraviolet or infrared radiation. A mask or screen may be applied to a surface of the polymer to define the shape and size of the stiffened portion. The stiffened portion may then be spatially configured to provide forces that resist contraction forces in a pre-strained portion resulting from stretching the pre-strained portion. Some masks provide differential radiation exposure to multiple portions of the polymer, thus permitting different portions of the polymer to be cured and stiffened to varying extents. In a specific embodiment, the mask reduces the amount of radiation exposure to an edge portion of the electroactive polymer. This increases the thickness of the edge portion and increases the polymer breakdown strength in this the edge portion (a similar effect may acquired using a support layer as described above with respect to FIG. 3A).

After the second curing is complete, the electroactive polymer is released from rigid frame or substrate temporarily fixing the pre-strain. A releasing agent such as isopropyl alcohol may be used to facilitate the release from a layered substrate.

After curing and formation of the electroactive polymer with pre-strain, one or more electrodes may be deposited onto a surface of the polymer. In a specific embodiment, one or more graphite electrodes are patterned and deposited using a mask or stencil. Electrodes comprising conductive greases mixed with a conductive silicone may be fabricated by dissolving the conductive grease and the uncured conductive silicone in a solvent. The solution may then be sprayed on the electroactive polymer material and may include a mask or stencil to achieve a particular electrode or active area pattern.

The transducer, comprising the pre-strained polymer and electrodes, may then be packaged or further assembled according to an application. Packaging may include assembly of multiple transducers mechanically linked or stacked as multiple layers. In addition, mechanical and electrical connections to the transducers may be formed according to a particular device design.

Maintaining Pre-Strain Via Support Layer Coupling

In another aspect, the present invention relates to a method for fabricating an electroactive polymer that comprises a support layer coupled to the polymer that maintains pre-strain in a portion of an electroactive polymer.

Figure 5:
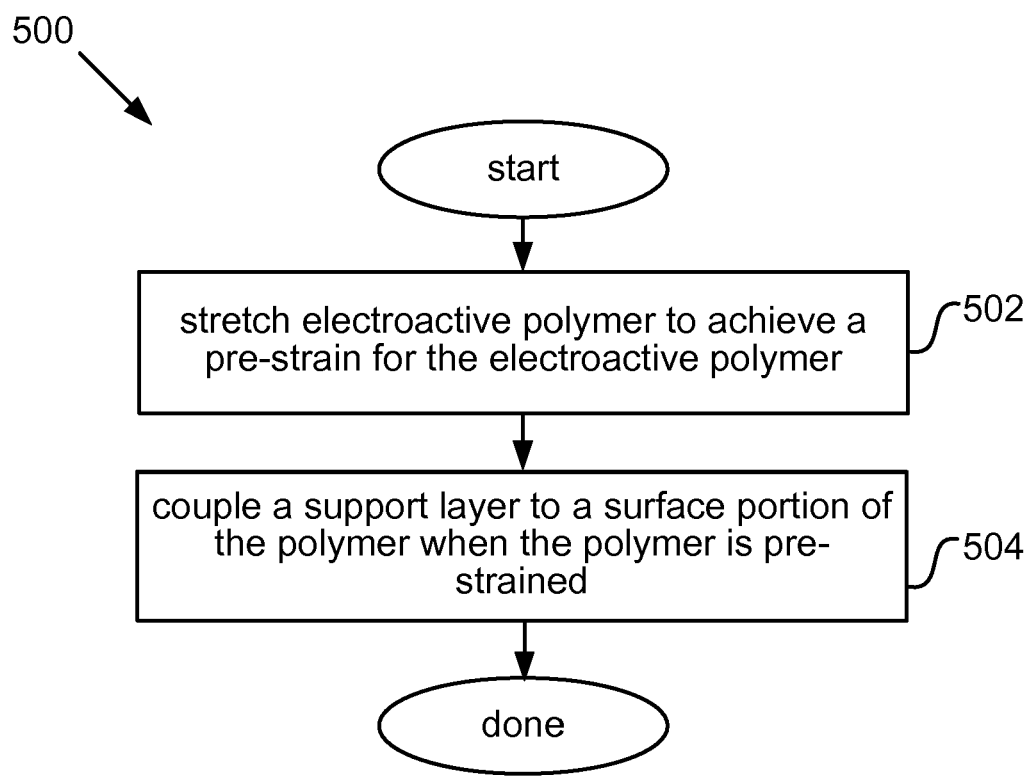
FIG. 5 illustrates a support layer coupling process flow for forming an electroactive polymer in accordance with one embodiment of the present invention.

FIG. 5 illustrates a support layer coupling process flow 500 for forming an electroactive polymer in accordance with one embodiment of the present invention. Processes in accordance with the present invention may include up to several additional steps not described or illustrated here in order not to obscure the present invention.

Process flow 500 begins by stretching the electroactive polymer to achieve a pre-strain in a portion of the polymer (502). Several techniques for stretching a polymer to achieve and temporarily maintain elastic pre-strain were described above with respect to 404 of process flow 400. For example, the electroactive polymer may be mechanically stretched in one or more directions and temporarily fixed to one or more solid members (e.g., rigid plates or a manufacturing frame) while stretched.

Before applying the pre-strain, the electroactive polymer may be received or fabricated according to several methods. In one embodiment, the polymer is a commercially available product such as a commercially available acrylic elastomer film. In another embodiment, the polymer is a film fabricated by one of casting, dipping, spin coating or spraying. Additional details for polymer fabrication are provided with respect to 704 of process flow 700.

Before application of the support layer, one or more electrodes may be deposited onto a surface of the polymer. Suitable techniques to apply an electrode, such as spraying and patterning using a mask or stencil, were described above.

Process flow 500 proceeds by coupling a support layer to a surface portion of the polymer when the polymer is pre-strained (504). The support layer overlaps the pre-strained portion and at least partially maintains the pre-strain in the portion. The support layer may also overlap one or more electrodes deposited on the polymer surface. Alternatively, as mentioned above, the support layer may be configured as an electrode. One exemplary support layer was described above with respect to FIG. 3A. In one embodiment, the support layer includes an elastic modulus greater than an elastic modulus for the polymer. The support layer may be a) deposited on the surface portion and cured thereon for coupling, or b) attached as a pre-cured film to the polymer-electrode transducer using a suitable adhesive. In some cases a light powder such as talc is desirable to prevent the support layer from sticking to itself. In a specific embodiment, the support layer includes a polymer, such as an elastic film, that is coupled via lamination to the surface portion of the polymer.

After securing the support layer to the electroactive polymer, the laminate is then released from the frame or device applying the temporary pre-strain. Releasing the laminate from the frame may force the support layer into compression. In some cases, the initial pre-strain in the electroactive polymer may reduce.

In a specific embodiment for process 500, a 1-mm thick acrylic electroactive polymer film was pre-strained 400%× 400% in area. The pre-strained area was 4"×4". Carbon fibrils in 70% isopropyl alcohol were applied onto the polymer as electrodes. The support layer comprised: 2.8 g of a mixture comprising 2 parts of 118 silicone to 1 part of 10 centistoke silicone oil. 0.7 g naptha was also added to the mixture to help spread the support layer. When released from the temporary pre-strain support, the acrylic electroactive polymer film contracted to about 200%×200% in area pre-strain. The polymer produced actuated strains as high as 70-80% linear strain, which is substantially above that achieved by an electroactive polymer without any pre-strain.

Curing Polymer Precursors to Stiffen a Polymer Portion

In another embodiment, the present invention cures a polymer precursor to maintain pre-strain in an electroactive polymer. The curable polymer precursor may be applied to a surface of an electroactive polymer sheet or film and allowed to coat, disperse or diffuse into the film. The additives are then cured to form one or more stiffer portions. In some cases, the curing "locks in" and maintains the pre-strain in the electroactive polymer film by forming a crosslinked network of polymer chains.

Figure 6:
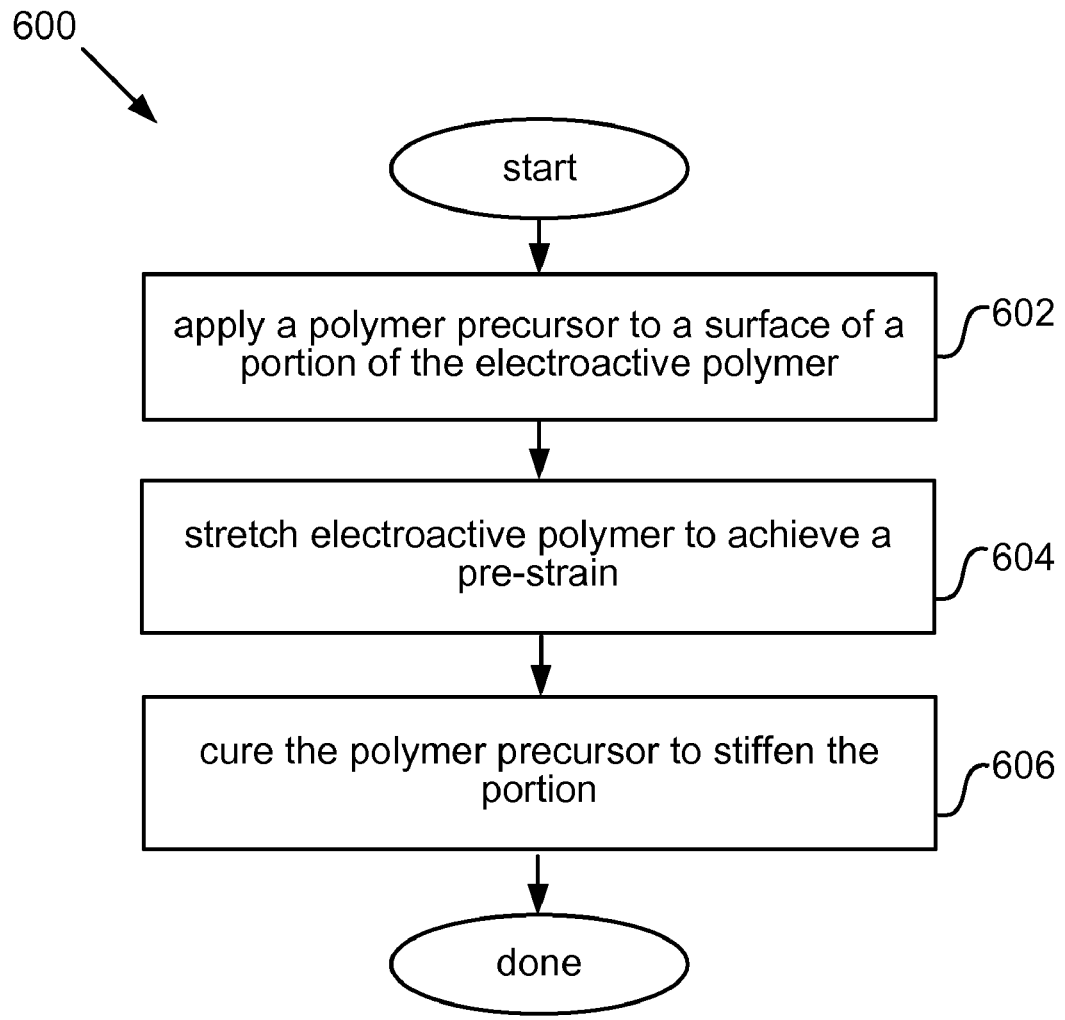
FIG. 6 illustrates a process flow that employs a polymer precursor for forming an electroactive polymer in accordance with one embodiment of the present invention.

FIG. 6 illustrates a process flow 600 that employs a polymer precursor for forming an electroactive polymer in accordance with one embodiment of the present invention. Processes in accordance with the present invention may include up to several additional steps not described or illustrated here in order not to obscure the present invention.

Process flow 600 begins by applying a polymer precursor to a surface of a portion of the electroactive polymer (or the entire portion, see FIG. 2B) (602). The electroactive polymer may be previously received or fabricated according to several methods, such as spin coating, as described above. In one embodiment, the polymer precursor (for example, acrylates with a suitable initiating agent) is applied to an electroactive polymer film and allowed to disperse into the bulk of the film. In one embodiment, the polymer precursor is applied onto one or more portions of a surface of an electroactive polymer by spraying (often from a dilute solution) or printing. The polymer precursor may also be selectively applied to limited portions through shadow masking or printing to allow for patterning of precise shapes and sizes of the surface portion, local reinforcement at the edges of a polymer, etc. Using a mask allows multiple portions of a portion to be easily patterned in a single step. The amount of precursor added will vary with the desired amount of pre-strain in the portion and/or a desired amount of contraction when releasing the polymer from temporary pre-strain.

In one embodiment, the polymer precursor is applied to all surfaces of the polymer where pre-strain is desired. In another embodiment, a stiffened portion of the electroactive polymer treated with the polymer precursor then serves as a structural element for holding pre-strain in another portion of the polymer (see stiff regions of FIG. 2A).

In many embodiments, the polymer precursor then at least partially diffuses into the polymer. It is understood that incomplete diffusion and dispersion into the polymer is suitable in many case. For less than full penetration, stiff layers may be formed in the polymer, which is acceptable in many applications. Diffusion into the polymer may proceed for an extended time, e.g., hours. Again, some embodiments involve merely coating the precursor onto the polymer and later curing the coating, without significantly diffusing into the underlying polymer substrate, to form a bilayer structure—resembling a laminate.

The polymer is then stretched to achieve a pre-strain in a portion of the polymer (604). Several techniques for stretching a polymer to achieve and temporarily maintain anisotropic and/or elastic pre-strain were described above with respect to 404 of process flow 400. In another embodiment, the polymer precursor is applied onto the surface after the electroactive polymer has been pre-strained. This may reduce time needed for the precursor to penetrate into the polymer.

Process flow proceeds by curing the polymer precursor to stiffen said portion (606). The polymer precursor, when cured, at least partially stiffens the electroactive polymer material in the portion. The polymer precursor may comprise a dimmer (i.e., each molecule contains two polymerizable groups) or an oligomer. One suitable class of polymer precursor includes acrylates. Many curable compounds may be used other than acrylates, including for example, methacrylates, epoxies, silicones, and the like. Any suitable stiffening agent that provides the necessary physical stiffening may be employed. The chemical composition is not a controlling factor.

The curing may be performed thermally, photochemically, etc. The polymerizable groups in the electroactive polymer precursor may undergo a chain-growth polymerization, a ring-opening polymerization, or step-growth polymerization, for example. Similar to that described above with respect to 406 of process flow 400, the curing may comprise exposing the electroactive polymer to radiation. A mask or screen may be applied to a surface of the polymer to define the curing action. Some masks provide differential radiation exposure to multiple portions of the polymer, thus permitting different portions of the polymer to be cured and stiffened to varying extents.

The amount of polymer precursor often affects stiffness of the portion after curing. Thus, a greater amount of the polymer precursor may be applied onto a second portion than a first portion.

After curing, one or more electrodes may be deposited onto a surface of the polymer. The surface may include the portion to be stiffened (see FIG. 2B) or a second pre-strained portion of the electroactive polymer bordered by the portion to be stiffened (see FIG. 2A). Suitable techniques to apply an electrode, such as spraying and patterning using a mask or stencil, were described above. The laminate is also subsequently released from the frame or device applying the temporary pre-strain.

In a specific embodiment for process flow 600, 1,6-Hexanediol diacrylate (3.2 grams) and benzoyl peroxide (0.32 grams) were mixed with 20 ml ethyl acetate. The solution was sprayed onto a VHB 4910 acrylic electroactive polymer with 300%×300% pre-strain. The polymer was then placed in a vacuum oven at 80 deg. C. for 5 hours. In this case, crosslinking in the polymer film caused by the polymer precursor was effective to support pre-strain. However, in this case, as the polymer becomes stiffer, the actuated strain upon application of a voltage reduces.

In another specific embodiment, 6-hexanediol diacrylate (2.0 grams) and benzoyl peroxide (0.2 grams) were mixed with 40 ml ethyl acetate. The solution was sprayed onto a VHB 4910 acrylic electroactive polymer film with 400%×400% pre-strain. The polymer films were then placed in a vacuum oven at 78 deg. C. for 4 hours.

| Diacrylate amount gram/25 sq. inch | 0 | 0.4 | 0.5 | 0.6 | 1.0 |
|---|---|---|---|---|---|
| Thickness on pre-strain frame (mil) | 1.4 | | 1.53 | | |
| Thickness after released (mil) | 38 | 3.35 | 3.7 | 2.6 | 2.2 |
| Actuation at 6.2 kV (area increase) | — | 100% | 100% 200% @ 7 kV | 80% | 20% 50% @ 8 kV |

Pre-Mixed Polymer Precursor Curing

In another embodiment, a precursor for a support polymer is mixed with a precursor for an electroactive polymer before forming the polymer, e.g. into a thin film. This is useful for electroactive polymers, such as elastomers, that are not chemically crosslinked and therefore can be dissolved and mixed together with the support polymer precursor.

Figure 7:
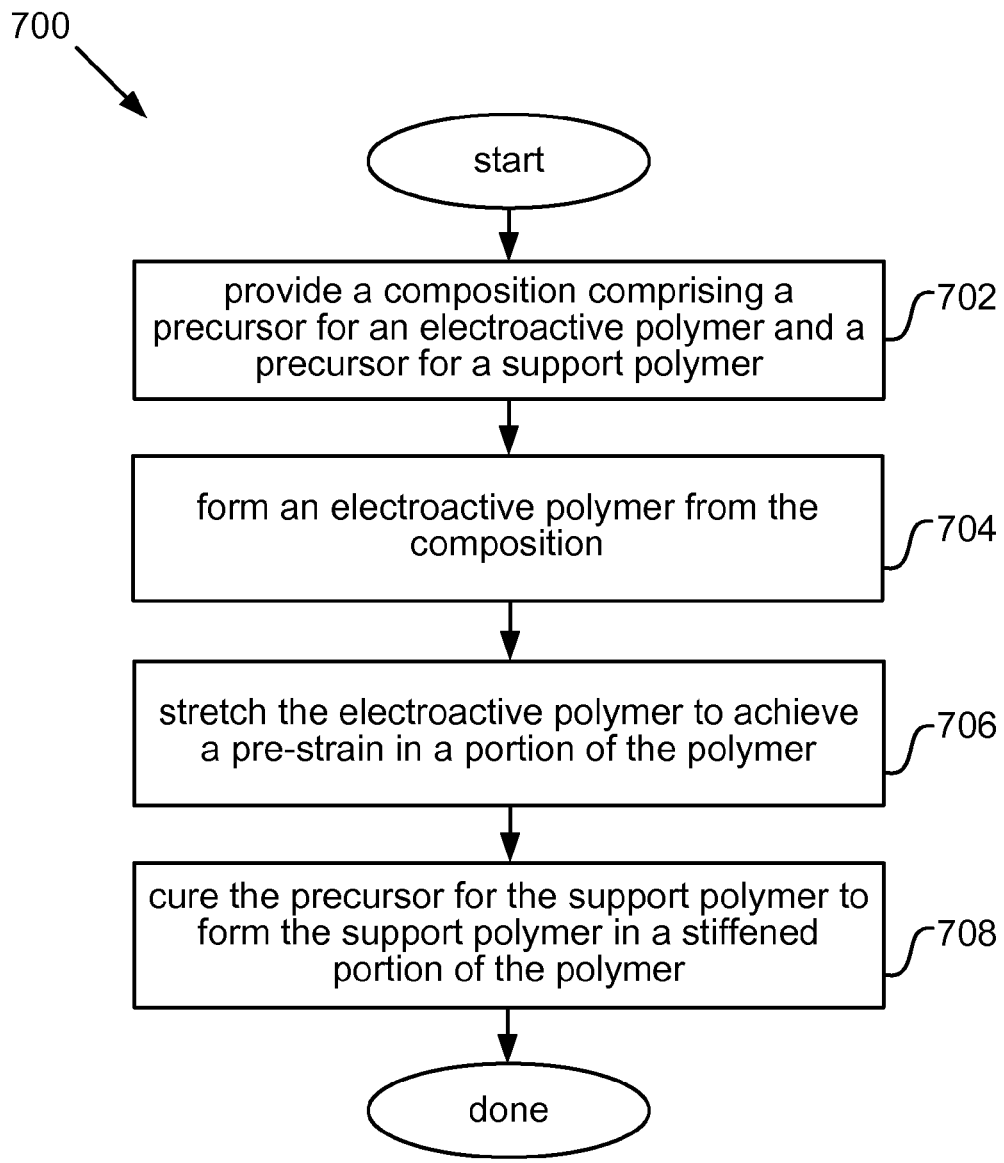
FIG. 7 illustrates a process flow that employs a composition comprising a polymer precursor for a support polymer and a precursor for an electroactive polymer for forming an electroactive polymer in accordance with one embodiment of the present invention.

FIG. 7 illustrates a process flow 700 that employs a composition comprising a polymer precursor for a support polymer and a precursor for an electroactive polymer for forming an electroactive polymer in accordance with one embodiment of the present invention. Processes in accordance with the present invention may include up to several additional steps not described or illustrated here in order not to obscure the present invention.

Process flow 700 begins by providing a composition comprising a precursor for an electroactive polymer and a precursor for a support polymer (702). Specific examples of polymer precursors were discussed above. Specific examples of non-crosslinked electroactive polymers include Kraton (a polystyrene-polybutadiene-polystyrene triblock copolymer by Shell) and thermoplastic polyurethanes.

The electroactive polymer is then formed from the composition (704). In one embodiment, the polymer is a film fabricated by one of casting, dipping, spin coating or spraying. Spin coating typically involves applying the composition on a rigid substrate and spinning to a desired thickness. The composition may include a precursor for a support polymer, a precursor for an electroactive polymer and a volatile dispersant or solvent. The amount of dispersant, the volatility of the dispersant, and the spin speed may be altered to produce a desired polymer. By way of example, polyurethane films may be spin coated in a solution of polyurethane and tetrahydrofuran (THF) or cyclohexanone. In the case of silicon substrates, the polymer may be spin coated on an aluminized plastic or a silicon carbide. The aluminum and silicon carbide form a sacrificial layer that is subsequently removed by a suitable etchant. Electroactive polymer films in the range of one micrometer thick may been produced by spin coating in this manner. Spin coating of polymer films, such as silicone, may be done on a smooth non-sticking plastic substrate, such as polymethyl methacrylate or teflon. The polymer film may then be released by mechanically peeling or with the assistance of alcohol or other suitable release agent. Spin coating is also suitable for producing thicker polymers in the range of 10-750 micrometers.

The polymer is then stretched to achieve a pre-strain in a portion of the polymer (706). Several techniques for stretching a polymer to achieve and temporarily maintain anisotropic and/or elastic pre-strain were described above with respect to 404 of process flow 400.

The precursor is then cured such that the support polymer forms the support polymer in a stiffened portion of the polymer (708). After curing, the electroactive polymer comprises two components: an underlying electroactive polymer and an additive. The composite electroactive polymer then comprises a flexible electroactive polymer sheet or film and a more rigid retaining polymer formed in or on the active polymer sheet and defining the stiffened region. The polymer precursor, when cured, at least partially stiffens the electroactive polymer material in the portion. In one embodiment, the polymer cross links with the support polymer. The curing may be performed thermally, photochemically, with radiation, etc. The polymerizable groups in the electroactive polymer precursor may undergo a chain-growth polymerization, a ring-opening polymerization, or step-growth polymerization, for example. Similar to that described above with respect to 406 of process flow 400, the curing may comprise exposing the electroactive polymer to radiation. A mask or screen may be applied to a surface of the polymer to define the curing action. Some masks provide differential radiation exposure to multiple portions of the polymer, thus permitting different portions of the polymer to be cured and stiffened to varying extents. The amount of polymer precursor often affects stiffness of the portion after curing. Thus, a greater amount of the polymer precursor may be applied onto a second portion than a first portion.

The polymer precursor, when cured, at least partially maintains the pre-strain in the pre-strained portion after curing. In one embodiment, the stiffened portion overlaps the pre-strained portion (see FIG. 2B). In another embodiment, the stiffened portion neighbors the pre-strained portion of the electroactive polymer (see FIG. 2A).

After curing, one or more electrodes may be deposited onto a surface of the polymer according to the creation of one or more active areas for the polymer. The polymer is also subsequently released from the frame or device applying the temporary pre-strain.

Mixing a precursor for an electroactive polymer and a precursor for a support polymer before forming the electroactive polymer may provide a more integrated composite polymer. After forming the composite polymer, the support polymer may be very evenly dispersed among the electroactive polymer chains. This highly integrated composite electroactive polymer may provide better mechanical stability, better support for pre-strain, and higher performance.

Multifunctionality

Electroactive polymers may convert between electrical energy and mechanical energy in a bi-directional manner. Thus, transducers as described herein may be used in an actuator that coverts electrical energy to mechanical energy and/or a generator that converts from mechanical energy to electrical energy. Sensing electrical properties of an electroactive polymer transducer also permits sensing functionality.

FIGS. 1A and 1B may be used to show one manner in which the transducer portion 10 converts mechanical energy to electrical energy. For example, if the transducer portion 10 is mechanically stretched by external forces to a thinner, larger area shape such as that shown in FIG. 1B, and a relatively small voltage difference (less than that necessary to actuate the film to the configuration in FIG. 1B) is applied between electrodes 14 and 16, the transducer portion 10 will contract in area between the electrodes to a shape such as in FIG. 1A when the external forces are removed. Stretching the transducer refers to deflecting the transducer from its original resting position—typically to result in a larger net area between the electrodes, e.g. in the plane defined by directions 18 and 20 between the electrodes. The resting position refers to the position of the transducer portion 10 having no external electrical or mechanical input and may comprise any prestrain in the polymer. Once the transducer portion 10 is stretched, the relatively small voltage difference is provided such that the resulting electrostatic forces are insufficient to balance the elastic restoring forces of the stretch. The transducer portion 10 therefore contracts, and it becomes thicker and has a smaller planar area in the plane defined by directions 18 and 20 (orthogonal to the thickness between electrodes). When polymer 12 becomes thicker, it separates electrodes 14 and 16 and their corresponding unlike charges, thus raising the electrical energy and voltage of the charge. Further, when electrodes 14 and 16 contract to a smaller area, like charges within each electrode compress, also raising the electrical energy and voltage of the charge. Thus, with different charges on electrodes 14 and 16, contraction from a shape such as that shown in FIG. 1B to one such as that shown in FIG. 1A raises the electrical energy of the charge. That is, mechanical deflection is being turned into electrical energy and the transducer portion 10 is acting as a generator.

In some cases, the transducer portion 10 may be described electrically as a variable capacitor. The capacitance decreases for the shape change going from that shown in FIG. 1B to that shown in FIG. 1A. Typically, the voltage difference between electrodes 14 and 16 will be raised by contraction. This is normally the case, for example, if additional charge is not added or subtracted from electrodes 14 and 16 during the contraction process. The increase in electrical energy, U, may be illustrated by the formula $U=0.5\ Q^2/C$, where Q is the amount of positive charge on the positive electrode and C is the variable capacitance which relates to the intrinsic dielectric properties of polymer 12 and its geometry. If Q is fixed and C decreases, then the electrical energy U increases. The increase in electrical energy and voltage can be recovered or used in a suitable device or electronic circuit in electrical communication with electrodes 14 and 16. In addition, the transducer portion 10 may be mechanically coupled to a mechanical input that deflects the polymer and provides mechanical energy.

Electroactive polymers of the present invention may also be configured as a sensor. Generally, an electroactive polymer sensor detects a "parameter" and/or changes in the parameter. The parameter is usually a physical property of an object such as strain, deformation, velocity, location, contact, acceleration, vibration, pressure, size, etc. In some cases, the parameter being sensed is associated with a physical "event". The physical event that is detected may be the attainment of a particular value or state for example. An electroactive polymer sensor is configured such that a portion of the electroactive polymer deflects in response to the change in a parameter being sensed. The electrical energy state and deflection state of the polymer are related. The change in electrical energy or a change in the electrical impedance of an active area resulting from the deflection may then be detected by sensing electronics in electrical communication with the active area electrodes. This change may comprise a capacitance change of the polymer, a resistance change of the polymer, and/or resistance change of the electrodes, or a combination thereof. Electronic circuits in electrical communication with electrodes detect the electrical property change. If a change in capacitance or resistance of the transducer is being measured for example, one applies electrical energy to electrodes included in the transducer and observes a change in the electrical parameters.

For ease of understanding, the present invention is mainly described and shown by focusing on a single direction of energy conversion. More specifically, the present invention focuses on converting electrical energy to mechanical energy. However, in all the figures and discussions for the present invention, it is important to note that the polymers and devices may convert between electrical energy and mechanical energy bi-directionally. Thus, any of the exemplary transducers described herein may be used with a generator or sensor. Typically, a generator of the present invention comprises a polymer arranged in a manner that causes a change in electric field in response to deflection of a portion of the polymer. The change in electric field, along with changes in the polymer dimension in the direction of the field, produces a change in voltage, and hence a change in electrical energy.

As the terms are used herein, a transducer refers to an electroactive polymer with at least two electrodes; an electroactive polymer device refers to a transducer with at least one additional mechanical coupling or component; an electroactive polymer actuator refers to a transducer or device configured to produce mechanical output of some form; an electroactive polymer generator refers to a transducer or device configured to produce electrical energy; and an electroactive polymer sensor refers to a transducer or device configured to sense a property or event.

Thus, polymers and transducers of the present invention may be used as an actuator to convert from electrical to mechanical energy, a generator to convert from mechanical to electrical energy, a sensor to detect changes in the mechanical or electrical state of the polymer, or combinations thereof. Mechanical energy may be applied to a transducer in a manner that allows electrical energy to be removed or electrical changes to be sensed. Many methods for applying mechanical energy, removing electrical energy and sensing electrical changes from the transducer are possible. Actuation, generation and sensing devices may require conditioning electronics of some type. For instance, at the very least, a minimum amount of circuitry is needed to apply or remove electrical energy from the transducer. Further, as another example, circuitry of varying degrees of complexity may be used to sense electrical states of a sensing transducer.

CONCLUSION

While this invention has been described in terms of several preferred embodiments, there are alterations, permutations, and equivalents that fall within the scope of this invention which have been omitted for brevity's sake. By way of example, although the present invention has been described in terms of several polymer materials and geometries, the present invention is not limited to these materials and geometries. It is therefore intended that the scope of the invention should be determined with reference to the appended claims.

What is claimed is:

1. A method for forming an electroactive polymer, the method comprising:
    partially curing a composition comprising a precursor for an electroactive polymer to form a partially cured electroactive polymer;
    stretching the partially cured electroactive polymer to achieve a pre-strain for the electroactive polymer; and
    further curing a portion of the electroactive polymer to stiffen said portion.

2. The method of claim 1 wherein the partial curing or the further curing employs a thermal cure.

3. The method of claim 1 wherein the stiffened portion borders a second pre-strained portion of the electroactive polymer and the stiffened portion is configured to maintain pre-strain for the second pre-strained portion.

4. The method of claim 3 wherein the stiffened portion is configured to provide forces that oppose elastic contraction forces in the pre-strained portion.

5. The method of claim 1 wherein the electroactive polymer includes an elastic modulus below 10 MPa and the stiffened portion is further cured to possess an elastic modulus above 10 MPa.

6. The method of claim 1 wherein further curing the electroactive polymer comprises exposing the electroactive polymer to radiation.

7. The method of claim 6 further comprising applying a mask to a surface of the polymer that defines the shape and size of the portion.

8. The method of claim 7 wherein the mask provides differential radiation exposure to the portion and a second portion of the electroactive polymer.

9. The method of claim 8 wherein the mask reduces the amount of radiation exposure to an edge portion of the electroactive polymer.

10. The method of claim 1 wherein the portion comprises a polymer precursor that when cured at least partially stiffens electroactive polymer.

11. The method of claim 1 wherein the electroactive polymer comprises a compliant electroactive polymer film and a support polymer formed in or on the compliant electroactive polymer film.

12. The method of claim 11 wherein curing of the support polymer stiffens the portion.

13. The method of claim 1 wherein the electroactive polymer is stretched in a first direction greater than in a second direction.

14. The method of claim 1 further comprising depositing an electrode to a surface of the electroactive polymer.

15. The method of claim 14 wherein the electrode is sprayed onto the polymer.

16. A method for forming an electroactive polymer transducer, the method comprising:
    partially curing a composition comprising a precursor for an electroactive polymer to form a partially cured electroactive polymer;
    stretching the partially cured electroactive polymer to achieve a pre-strain for the electroactive polymer; and
    further curing a portion of the electroactive polymer to stiffen said portion; and
    depositing a first electrode to a first surface of the electroactive polymer,
    depositing a second electrode to a second surface of the electroactive polymer.

17. The method of claim 16 wherein the stiffened portion is configured to provide forces that oppose elastic contraction forces in the pre-strained portion.

18. The method of claim 16 wherein the electroactive polymer includes an elastic modulus below 10 MPa and the stiffened portion is further cured to possess an elastic modulus above 10 MPa.

19. A method for forming an electroactive polymer, the method comprising:
    partially curing a composition comprising a precursor for an electroactive polymer to form a partially cured electroactive polymer;
    stretching the partially cured electroactive polymer to achieve a pre-strain for the electroactive polymer; and
    further curing a portion of the electroactive polymer to form a stiffened portion that borders a second pre-strained portion of the electroactive polymer and the stiffened portion is configured to maintain pre-strain for the second pre-strained portion.

20. The method of claim 19 wherein the electroactive polymer includes an elastic modulus below 10 MPa and the stiffened portion is further cured to possess an elastic modulus above 10 MPa.

* * * * *